United States Patent
Okamoto

(10) Patent No.: US 12,176,265 B2
(45) Date of Patent: Dec. 24, 2024

(54) SEMICONDUCTOR DEVICE, HAVING VIA WIRING, METHOD OF MANUFACTURING SEMICONDUCTOR DEVICE HAVING VIA WIRING, AND ELECTRONIC APPARATUS WITH SEMICONDUCTOR DEVICE HAVING VIA WIRING

(71) Applicant: FUJITSU LIMITED, Kawasaki (JP)

(72) Inventor: Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 343 days.

(21) Appl. No.: 17/395,505

(22) Filed: Aug. 6, 2021

(65) Prior Publication Data

US 2022/0181236 A1    Jun. 9, 2022

(30) Foreign Application Priority Data

Dec. 4, 2020    (JP) ................................. 2020-201956

(51) Int. Cl.
*H01L 21/768*    (2006.01)
*H01L 23/48*    (2006.01)
(Continued)

(52) U.S. Cl.
CPC ...... *H01L 23/481* (2013.01); *H01L 21/76898* (2013.01); *H01L 23/66* (2013.01);
(Continued)

(58) Field of Classification Search
CPC ............. H01L 21/76898; H01L 23/481; H01L 29/2003; H01L 29/66431; H01L 29/66462;
(Continued)

(56) References Cited

U.S. PATENT DOCUMENTS 4,706,870 A  *  11/1987  Legge ...................... C23G 5/00
                                                        228/123.1
4,842,699 A  *   6/1989  Hua ...................... H01L 23/481
                                                        257/E21.597
(Continued)

FOREIGN PATENT DOCUMENTS

JP    2007-157806 A    6/2007
JP    2011-192836 A    9/2011
(Continued)

OTHER PUBLICATIONS

Yusuke Kumazaki et al., "Remarkable Current Collapse Suppression in GaN HEMTs on Free-standing GaN Substrates", 2019 IEEE BiCMOS and Compound Semiconductor Integrated Circuits and Technology Symposium (BCICTS2019), Nashville, Tennessee, USA, Nov. 3-6, 2019 (Total 4 pages).
(Continued)

*Primary Examiner* — Eric A. Ward
(74) *Attorney, Agent, or Firm* — Fujitsu Intellectual Property Center

(57) ABSTRACT

A semiconductor device includes a first layer that contains gold (Au) and is formed on one surface of a semiconductor substrate and a second layer that contains nickel (Ni) and is formed on the first layer. The semiconductor device is provided with a via hole that passes through the second layer, the first layer, and the semiconductor substrate from one surface to another surface opposite thereto, and a via wiring is formed on the inner surface of the via hole. The second layer is a mask used when the semiconductor substrate is etched to form the via hole, and the first layer is a base layer for forming the second layer on the semiconductor substrate. By using an Au-containing layer as the first layer, side etching on the first layer is prevented when the
(Continued)

semiconductor substrate is etched, and disconnection of the via wiring is prevented.

15 Claims, 24 Drawing Sheets

(51) Int. Cl.
  *H01L 23/66*   (2006.01)
  *H01L 29/20*   (2006.01)
  *H01L 29/417*   (2006.01)
(52) U.S. Cl.
  CPC ...... *H01L 29/2003* (2013.01); *H01L 29/4175* (2013.01); *H01L 2223/6616* (2013.01)
(58) Field of Classification Search
  CPC ........... H01L 29/4175; H01L 29/66446; H01L 29/205; H01L 29/778–7789
  See application file for complete search history.

(56) References Cited

U.S. PATENT DOCUMENTS

| | | | | |
|---|---|---|---|---|
| 6,268,619 | B1* | 7/2001 | Kosaki | H01L 21/76838 257/E21.582 |
| 8,563,433 | B2* | 10/2013 | Kosaka | H01L 21/3065 257/E21.232 |
| 2003/0045024 | A1* | 3/2003 | Shimoto | H05K 3/20 438/106 |
| 2004/0018734 | A1* | 1/2004 | Schermerhorn | H01L 21/3081 438/719 |
| 2007/0128852 | A1 | 6/2007 | Shirahama et al. | |
| 2007/0132017 | A1* | 6/2007 | Oikawa | H01L 29/7809 257/E21.597 |
| 2012/0021598 | A1* | 1/2012 | Kawakubo | H01L 21/76898 257/E23.028 |
| 2014/0159049 | A1* | 6/2014 | Ko | H01L 29/66462 438/191 |
| 2014/0209893 | A1 | 7/2014 | Okamoto | |
| 2016/0343809 | A1* | 11/2016 | Green | H01L 23/66 |
| 2020/0098634 | A1 | 3/2020 | Tsunami | |

FOREIGN PATENT DOCUMENTS

| | | |
|---|---|---|
| JP | 2013-141008 A | 7/2013 |
| JP | 2014-146705 A | 8/2014 |
| WO | 2018/173275 A1 | 9/2018 |

OTHER PUBLICATIONS

Japanese Patent Office Action dated Jun. 25, 2024 for corresponding Japanese Application No. 2020-201956, with English Translations, 14 pages.

* cited by examiner

SEMICONDUCTOR DEVICE, HAVING VIA WIRING, METHOD OF MANUFACTURING SEMICONDUCTOR DEVICE HAVING VIA WIRING, AND ELECTRONIC APPARATUS WITH SEMICONDUCTOR DEVICE HAVING VIA WIRING

CROSS-REFERENCE TO RELATED APPLICATION

This application is based upon and claims the benefit of priority of the prior Japanese Patent Application No. 2020-201956, filed on Dec. 4, 2020, the entire contents of which are incorporated herein by reference.

FIELD

The embodiments discussed herein relate to a semiconductor device, a semiconductor device manufacturing method, and an electronic apparatus.

BACKGROUND

There is known a technique for forming a via wiring on the inner surface of a via hole that passes through a semiconductor substrate from one surface thereof to another surface thereof and electrically connecting these surfaces of the semiconductor substrate with the via wiring.

For example, in relation to a high electron mobility transistor (HEMT) using nitride semiconductor such as gallium nitride (GaN), there is known a technique for forming a via hole in a nitride semiconductor layer at which the transistor structure is formed and in a silicon carbide (SiC) substrate serving as a base substrate on which the nitride semiconductor layer is stacked and forming a via wiring on the inner surface of the via hole. The following method is known as a method for forming a via hole. That is, first, a nickel (Ni) layer is formed on a SiC substrate via a base layer, which is a multi-layer structure of tantalum (Ta) and cupper (Cu). Next, an opening is formed in these layers, and etching is performed by using the Ni layer as a mask. As a result, a via hole that passes through the Ni layer, the base layer, and the SiC substrate, and a nitride semiconductor layer stacked thereon is formed. A via wiring is formed on the inner surface of the via hole formed as described above. For example, see the following literature.

Japanese Laid-open Patent Publication No. 2013-141008

When a via hole that passes through a semiconductor substrate or a semiconductor substrate formed by a semiconductor layer and a base substrate stacked thereon from one surface thereof to another surface thereof is formed by etching, for example, Ni achieving high etching selectivity is used as a mask. Between such Ni used as the mask and a semiconductor substrate to be etched, there may be a base layer, e.g., a multi-layer structure of Ta and Cu as described above, for forming the Ni mask on the semiconductor substrate.

In this connection, when the semiconductor substrate is etched, if the etching selectivity of the base layer of the Ni mask is low, side etching could occur on the base layer. If side etching occurs on the base layer, when a via hole that passes through the Ni mask, the base layer, and the semiconductor substrate is formed and a via wiring is formed on the inner surface of the via hole, forming of the via wiring is hindered at a stepped portion caused by the side etching. As a result, the via wiring could be disconnected. Disconnection of the via wiring could prevent electrical connection between one surface and another surface of the semiconductor substrate and could deteriorate the performance of the semiconductor device including this semiconductor substrate.

SUMMARY

According to one aspect, there is provided a semiconductor device, including: a semiconductor substrate; a first layer that contains gold (Au) and is formed on a first surface of the semiconductor substrate; a second layer that contains nickel (Ni) and is formed on a second surface of the first layer, the second surface being opposite to the semiconductor substrate; a via hole that passes through the second layer, the first layer, and the semiconductor substrate from the first surface to a third surface opposite to the first surface; and a via wiring that is formed on an inner surface of the via hole.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

Figure 1:
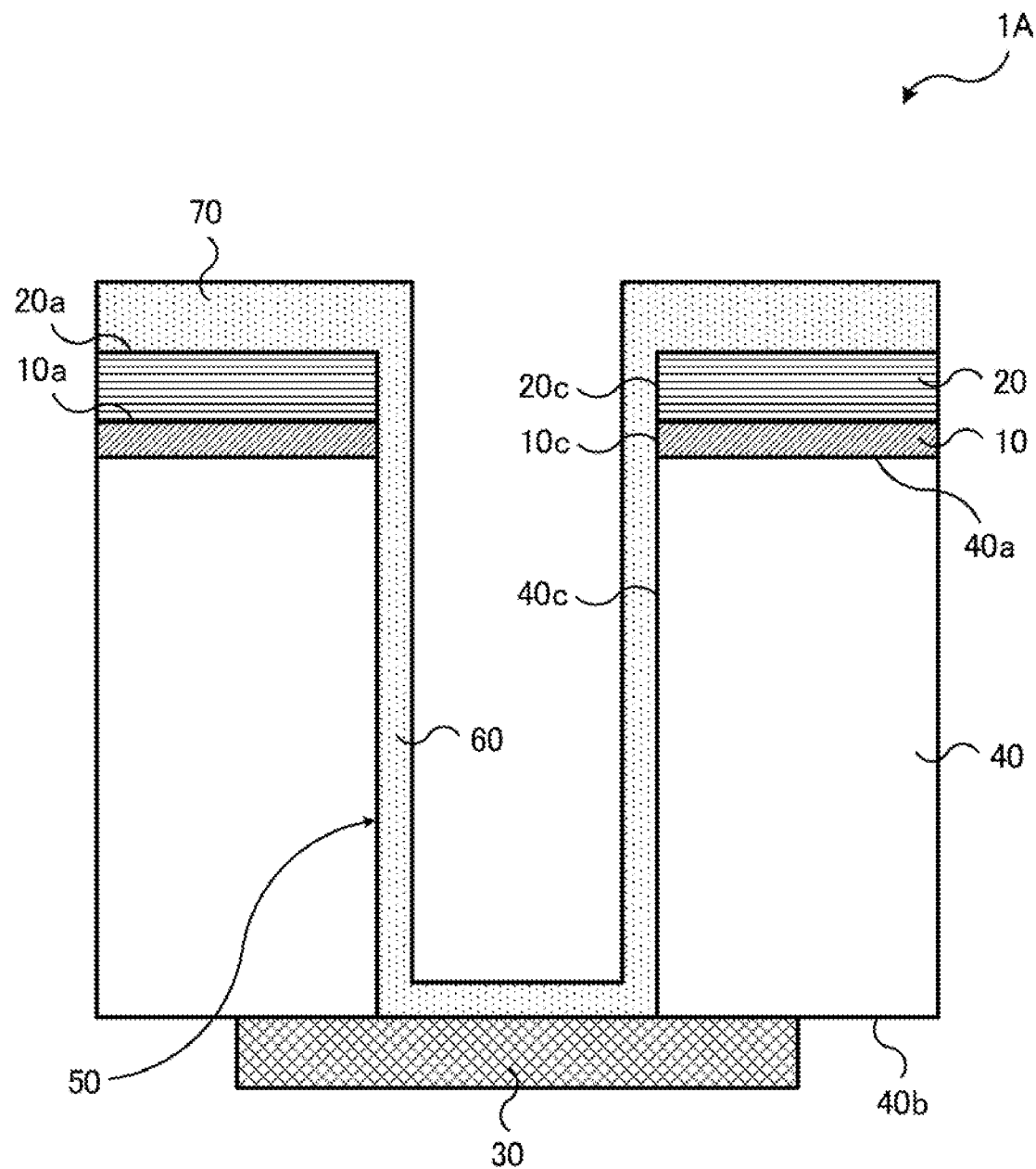
FIG. 1 illustrates a first example of a semiconductor device according to a first embodiment.

FIG. 1 illustrates a first example of a semiconductor device according to a first embodiment. More specifically, FIG. 1 is a schematic cross section of a main portion of a first example of a semiconductor device according to a first embodiment.

This semiconductor device 1A illustrated in FIG. 1 includes a semiconductor substrate 40, a first layer 10, a second layer 20, a third layer 30, a via hole 50, a via wiring 60, and a wiring 70.

In the case of the semiconductor device 1A, a semiconductor element (not illustrated), such as a transistor, is formed, for example, on a surface 40b of the semiconductor substrate 40 or inside a superficial portion of the surface 40b. The first layer 10 is formed on a surface 40a of the semiconductor substrate 40, the surface 40a being opposite to the surface 40b. The second layer 20 is formed on a surface 10a of the first layer 10, the surface 10a being opposite to the semiconductor substrate 40. The third layer 30 is formed on the surface 40b of the semiconductor substrate 40. The via hole 50 is formed to pass through the second layer 20, the first layer 10, and the semiconductor substrate 40 from the surface 40a to the surface 40b and to reach the third layer 30. The via wiring 60 is formed on the inner surface of the via hole 50, that is, on the inner surface of an opening portion 20c of the second layer 20, the inner surface of an opening portion 10c of the first layer 10, the opening portion 10c being connected to the opening portion 20c, and the inner surface of an opening portion 40c of the semiconductor substrate 40, the opening portion 40c being connected to the opening portion 10c. The via wiring 60 is connected to the third layer 30 formed on the surface 40b of the semiconductor substrate 40. The wiring 70 is formed on a surface 20a of the second layer 20, the surface 20a being opposite to the first layer 10, such that the wiring 70 continues from the via wiring 60 formed on the inner surface of the via hole 50.

In the case of the semiconductor device 1A, a layer containing gold (Au), for example, an Au layer or a layer containing Au as its main component, is used as the first layer 10 formed on the surface 40a of the semiconductor substrate 40. In addition, a layer containing Ni, for example, an Ni layer or a layer containing Ni as its main component, is used as the second layer 20 formed on the surface 10a of the first layer 10. In addition, a metal layer, for example, a layer containing Ni, is used as the third layer 30 formed on the surface 40b of the semiconductor substrate 40. Metal material, for example, material containing Au, is used for the via wiring 60 and the wiring 70.

The second layer 20 of the semiconductor device 1A serves as a mask when the opening portion 40c is formed in the semiconductor substrate 40 by etching. The first layer 10 serves as a base layer when the second layer 20 serving as a mask is formed at the surface 40a of the semiconductor substrate 40. For example, when the semiconductor substrate 40 having a thickness of approximately 100 μm is etched, a relatively thick mask having at least approximately a few μm is used in view of reduction of the layer thickness by the etching. Thus, when the second layer 20 containing Ni is formed, an electroplating method is used. Use of an electroplating method makes it easier to form a thick layer than use of a deposition method, a sputtering method, or the like. In addition, with an electroplating method, a layer having lower stress is formed. The first layer 10 is a seed layer used when the second layer 20 is formed by an electroplating method.

In the case of the semiconductor device 1A, an Au-containing layer is used as the first layer 10, which serves as a base layer of the second layer 20, which serves as a mask. In this way, when the via hole is formed by etching the semiconductor substrate 40 while using the second layer 20 containing Ni as a mask, occurrence of side etching on the first layer 10 is prevented.

Next, an example in which a GaN substrate is used as the semiconductor substrate 40 will be described.

Figure 2:
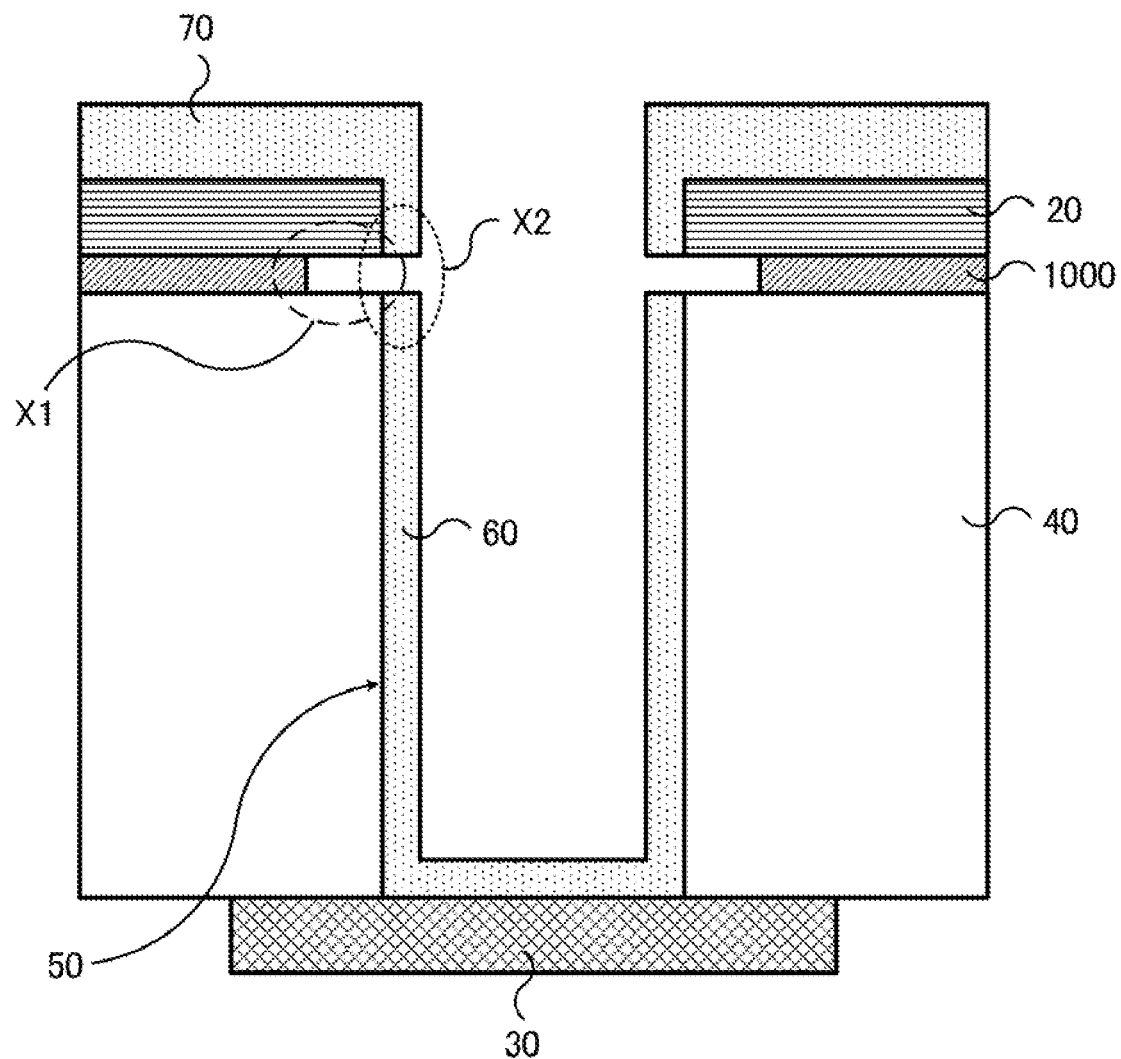
FIG. 2 illustrates a first comparison example, which is compared with the first example of the semiconductor device.

FIG. 2 illustrates a first comparison example, which is compared with the first example of the semiconductor device. More specifically, FIG. 2 is a schematic cross section of a main portion of a first comparison example, which is compared with the first example of the semiconductor device.

When a GaN substrate is used as a semiconductor substrate 40, chlorine (Cl)-based gas, such as a mixed gas of chlorine ($Cl_2$) and boron trichloride ($BCl_3$), is used for etching the GaN substrate. By performing etching, such as inductively coupled plasma (ICP) etching, with Cl-based gas while using a second layer 20 as a mask, a via hole 50 is formed in the semiconductor substrate 40.

If the second layer 20 containing Ni is used as a mask for the etching of the semiconductor substrate 40 and if, for example, a Cu layer or a layer containing Cu as its main component is used as a first layer 1000, which is a base layer of the second layer 20, side etching could occur on the first layer 1000 due to the Cl-based gas, as illustrated by a portion X1 in FIG. 2. The first layer 1000, which is a Cu layer or a layer containing Cu as its main component, has a relatively high etching resistance with respect to fluorine (F)-based gas, which is widely used for etching a SiC substrate and the like. However, since the first layer 1000 has a relatively low etching resistance with respect to Cl-based gas used for etching a GaN substrate, the side etching as illustrated in FIG. 2 easily occurs.

If side etching occurs on the first layer 1000, a stepped portion is formed on the first layer 1000 at the inner surface of the via hole 50. If such a stepped portion is formed at the inner surface of the via hole 50, forming of the via wiring 60 is prevented at the stepped portion. As a result, the via wiring 60 to be formed could be disconnected as illustrated by a portion X2 in FIG. 2.

In contrast, the second layer 20 containing Ni is used as a mask for etching the semiconductor substrate 40, and an Au-containing layer is used as the first layer 10, which is the base layer of the second layer 20. Therefore, side etching on the first layer 10 by the Cl-based gas is prevented as illustrated in FIG. 1. This is because the first layer 10, which is an Au-containing layer, has a relatively high etching resistance with respect to the Cl-based gas. In this way, since forming of a stepped portion on the first layer 10 at the inner surface of the via hole 50 is prevented, disconnection of the via wiring 60 formed on the inner surface of the via hole 50 is prevented.

Figure 3:
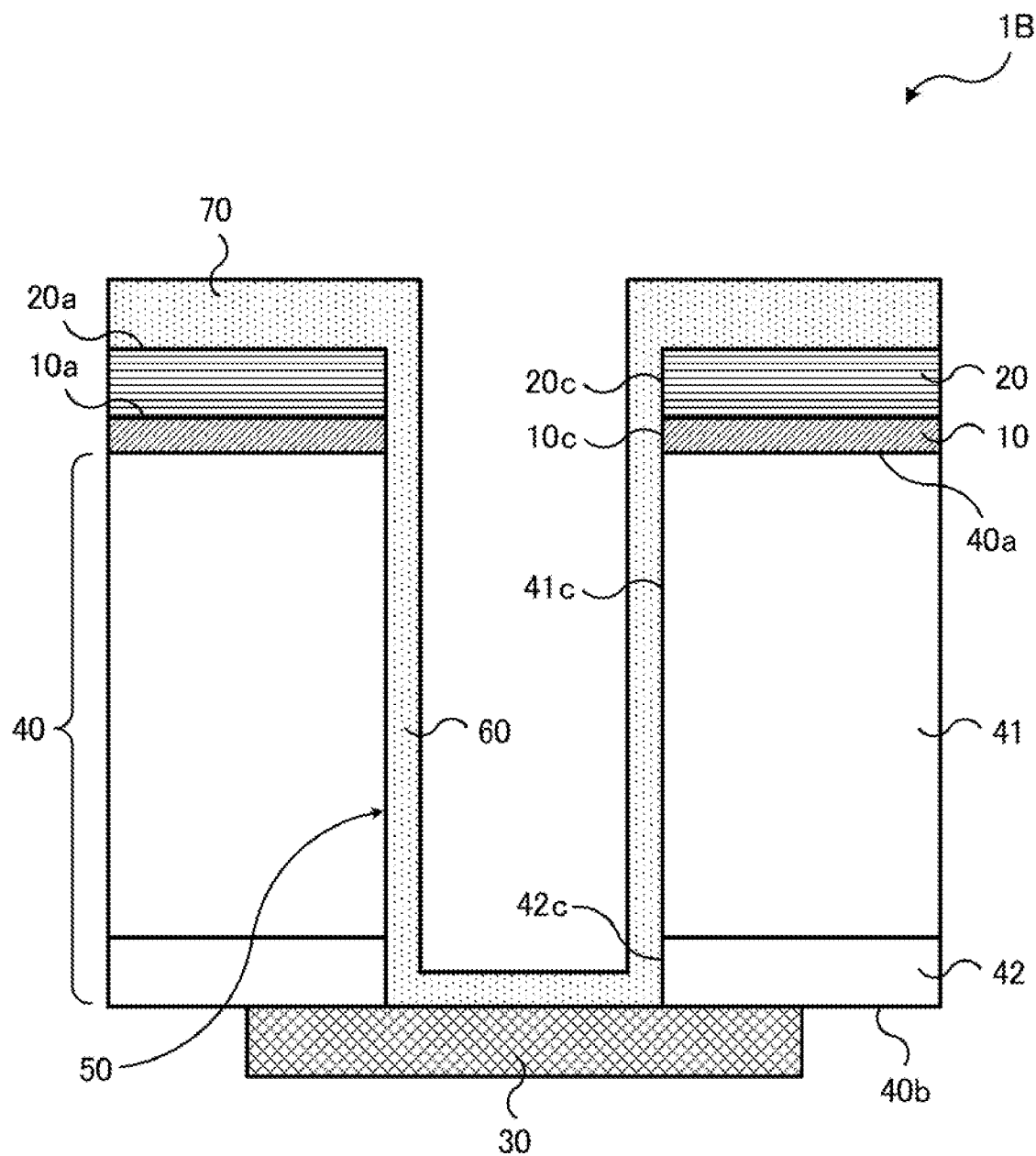
FIG. 3 illustrates a second example of the semiconductor device according to the first embodiment.

FIG. 3 illustrates a second example of the semiconductor device according to the first embodiment. More specifically, FIG. 3 is a schematic cross section of a main portion of a second example of the semiconductor device according to the first embodiment.

This semiconductor device 1B illustrated in FIG. 3 includes a semiconductor substrate 40, which is formed by a base substrate 41 and a semiconductor layer 42 stacked thereon.

A first layer 10 containing Au is formed on a surface 40a of the base substrate 41 of the semiconductor substrate 40, and a second layer 20 containing Ni is formed on a surface 10a of the first layer 10, the surface 10a being opposite to the semiconductor substrate 40. A third layer 30 is formed on a surface 40b of the semiconductor layer 42 stacked on the base substrate 41 of the semiconductor substrate 40. A via hole 50 is formed to pass through the second layer 20, the first layer 10, and the semiconductor substrate 40 from the surface 40a of the base substrate 41 to the surface 40b of the semiconductor layer 42 and to reach the third layer 30. A via wiring 60 is formed on the inner surface of the via hole 50, that is, on the inner surface of an opening portion 20c of the second layer 20, the inner surface of an opening portion 10c of the first layer 10, the opening portion 10c being connected to the opening portion 20c, the inner surface of an opening portion 41c of the base substrate 41, the opening portion 41c being connected to the opening portion 10c, and the inner surface of an opening portion 42c of the semiconductor layer 42. The via wiring 60 is connected to the third layer 30 formed on the surface 40b of the semiconductor layer 42 of the semiconductor substrate 40. A wiring 70 is formed on a surface 20a of the second layer 20, the surface 20a being opposite to the first layer 10, such that the wiring 70 continues from the via wiring 60 formed on the inner surface of the via hole 50.

In the case of the semiconductor device 1B, the via hole 50 is formed by using the second layer 20 containing Ni as a mask and etching the base substrate 41 and the semiconductor layer 42 of the semiconductor substrate 40. Since an Au-containing layer is used as the first layer 10, which is the base layer of the second layer 20, when the via hole is formed by etching the semiconductor substrate 40 while using the second layer 20 as a mask, side etching on the first layer 10 is prevented.

An example in which a GaN substrate is used as a base substrate 41 of a semiconductor substrate 40 and a GaN-based nitride semiconductor layer is used as a semiconductor layer 42 will be described.

Figure 4:
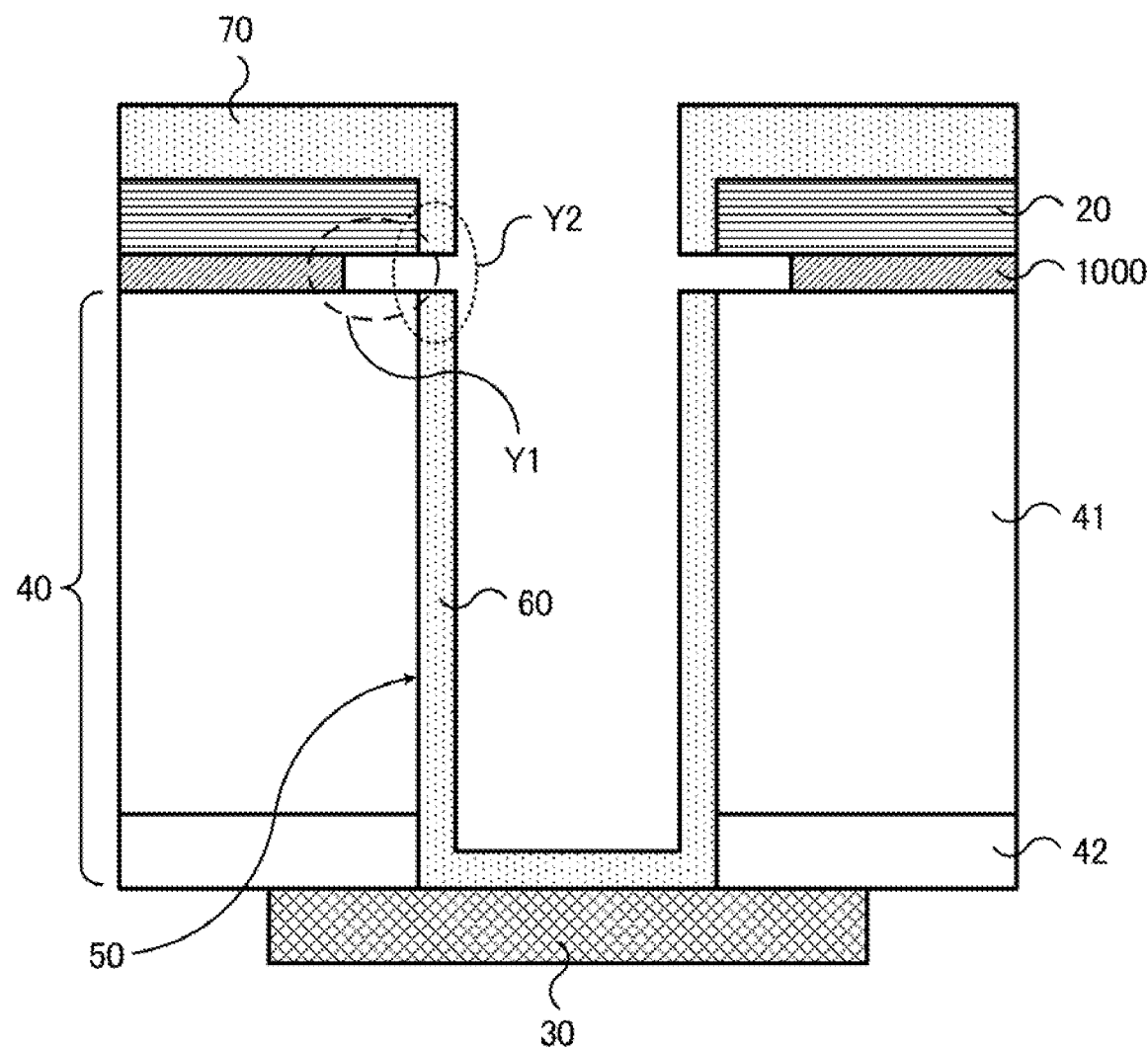
FIG. 4 illustrates a second comparative example, which is compared with the second example of the semiconductor device.

FIG. 4 illustrates a second comparative example, which is compared with the second example of the semiconductor device. More specifically, FIG. 4 is a schematic cross section of a main portion of a second comparison example, which is compared with the second example of the semiconductor device.

When a GaN substrate is used as the base substrate 41 of the semiconductor substrate 40 and a GaN-based nitride semiconductor layer is used as the semiconductor layer 42, Cl-based gas, such as a mixed gas of $Cl_2$ and $BCl_1$, is used, and the base substrate 41 is etched by using a second layer 20 as a mask. Next, the semiconductor layer 42 is etched.

If the second layer 20 containing Ni is used as a mask for the etching of the semiconductor substrate 40 and if, for example, a Cu layer or a layer containing Cu as its main component is used as a first layer 1000, which is the base layer of the second layer 20, side etching could occur on the first layer 1000 by the Cl-based gas, as illustrated by a portion Y1 in FIG. 4. This is because the first layer 1000, which is a Cu layer or a layer containing Cu as its main component, has a relatively low etching resistance with respect to Cl-based gas. If side etching occurs on the first layer 1000, a stepped portion is formed at the inner surface of the via hole 50. As a result, forming of the via wiring 60 could be prevented at the stepped portion, and the via wiring 60 to be formed could be disconnected, as illustrated by a portion Y2 in FIG. 4.

In contrast, since the second layer 20 containing Ni is used as a mask for the etching of the semiconductor substrate 40 and an Au-containing layer is used as the first layer 10 serving as the base layer of the second layer 20, side etching on the first layer 10 by the Cl-based gas is prevented, as illustrated in FIG. 3. This is because the first layer 10, which is an Au-containing layer, has a relatively high etching resistance with respect to the Cl-based gas. In this way, since forming of a stepped portion on the first layer 10 at the inner surface of the via hole 50 is prevented, disconnection of the via wiring 60 to be formed on the inner surface of the via hole 50 is prevented.

There are cases in which, other than the above GaN substrate, a SiC substrate or a Si substrate is used as the base substrate 41 of the semiconductor layer 42, for which a GaN-based nitride semiconductor layer is used, of the semiconductor substrate 40 as illustrated in FIG. 4. In such a case, first, the base substrate 41 is etched by using fluorine (F)-based gas, such as a mixed gas of sulfur hexafluoride ($SF_6$) and methane trifluoride ($CHF_3$), while using the second layer 20 as a mask. Next, the semiconductor layer 42 is etched by using Cl-based gas, such as a mixed gas of $Cl_2$ and $BCl_3$, while using the second layer 20 as a mask. If a Cu layer or a layer containing Cu as its main component is used as the first layer 1000, which is the base layer of the mask for the etching, depending on the etching conditions, as is the case with the second comparison example illustrated in FIG. 4, the first layer 1000 is exposed to the Cl-based gas used for the etching of the semiconductor layer 42, and side etching could occur on the first layer 1000. If side etching occurs on the first layer 1000, a stepped portion could be formed at the inner surface of the via hole 50, and the via wiring 60 to be formed could be disconnected.

In contrast, since an Au-containing layer is used as the first layer 10, which serves as the base layer of the mask when the semiconductor substrate 40 is etched, side etching on the first layer 10 is prevented, as is the case with the second example in FIG. 3. That is, even if a SiC substrate or the like is used as the base substrate 41 of the semiconductor substrate 40 and a GaN-based nitride semiconductor layer is used as the semiconductor layer 42, side etching on the first layer 10 is prevented when the GaN-based nitride semiconductor layer is etched. In this way, since forming of a stepped portion on the first layer 10 at the inner surface of the via hole 50 is prevented, disconnection of the via wiring 60 to be formed on the inner surface of the via hole 50 is prevented.

Regarding the above semiconductor device 1A (FIG. 1) and the semiconductor device 1B (FIG. 3), other than a GaN substrate, any one of various kinds of nitride semiconductor substrates may be used as the semiconductor substrate 40 of the semiconductor device 1A and the base substrate 41 of the semiconductor substrate 40 of the semiconductor device 1B. For example, a nitride semiconductor substrate expressed by a general formula $In_xAl_yGa_{1-(x+y)}N$ ($0 \le x \le 1$, $0 \le y \le 1$, $0 \le x+y \le 1$) may be used as the semiconductor substrate 40 of the semiconductor device 1A or the base substrate 41 of the semiconductor substrate 40 of the semiconductor device 1B. That is, a GaN substrate, an AlN substrate, an InN substrate, an AlGaN substrate, an InGaN substrate, an InAlGaN substrate, or the like may be used as the semiconductor substrate 40 of the semiconductor device 1A or the base substrate 41 of the semiconductor substrate 40 of the semiconductor device 1B. Even when any one of the above nitride semiconductor substrates is used, by using the first layer 10 containing Au, side etching on the first layer 10 is prevented when the via hole 50 is formed. Thus, disconnection of the via wiring 60 to be formed on the inner surface of the via hole 50 is prevented.

Alternatively, a SiC substrate or a Si substrate may be used as the semiconductor substrate 40 of the semiconductor device 1A or the base substrate 41 of the semiconductor substrate 40 of the semiconductor device 1B. This is because the first layer 10 containing Au also has a relatively high etching resistance with respect to F-based gas used for the etching of a SiC substrate or a Si substrate. In addition, in the same light, a compound semiconductor substrate, such as a silicon germanium (SiGe) substrate, a gallium arsenide (GaAs) substrate, or an indium phosphide (InP) substrate, may be used as the semiconductor substrate 40 of the semiconductor device 1A or the base substrate 41 of the semiconductor substrate 40 of the semiconductor device 1B.

In addition, any one of various kinds of nitride semiconductor layers may be used as the semiconductor layer 42 of the semiconductor substrate 40 of the semiconductor device 1B. For example, a single layer structure of a nitride semiconductor substrate expressed by the general formula $In_xAl_yGa_{1-(x+y)}N$ ($0 \le x \le 1$, $0 \le y \le 1$, $0 \le x+y \le 1$) may be used as the semiconductor layer 42. Alternatively, a multi-layer structure of two or more kinds of nitride semiconductor layers expressed by the above general formula may be used as the semiconductor layer 42. That is, a single layer structure formed by one kind selected from of a GaN layer, an AlN layer, an InN layer, an AlGaN layer, an InGaN layer, an InAlGaN layer, etc. may be used as the semiconductor layer 42. Alternatively, a multi-layer structure formed by two or more kinds selected from the above group may be used as the semiconductor layer 42. Even when any one of the various kinds of nitride semiconductor layers in used, by using the first layer 10 containing Au, side etching on the first layer 10 is prevented when the via hole 50 is formed. Thus, disconnection of the via wiring 60 to be formed on the inner surface of the via hole 50 is prevented.

Alternatively, a SiC layer or a Si layer may be used as the semiconductor layer 42 of the semiconductor substrate 40 of the semiconductor device 1B. This is because the first layer 10 containing Au also has a relatively high etching resistance with respect to F-based gas used for the etching of a SiC layer or a Si layer. In addition, in the same light, a compound semiconductor layer, such as a SiGe, GaAs, or InP layer, may be used as the semiconductor layer 42 of the semiconductor substrate 40 of the semiconductor device 1B.

Various kinds of transistors may be formed as semiconductor elements on or in the semiconductor substrate 40 of the semiconductor device 1A or 1B. For example, various kinds of transistors, such as an HEMT, a heterojunction bipolar transistor (HBT), a fin field-effect transistor (FET), a nanowire FET, or a metal insulator semiconductor (MIS) transistor, may be formed on or in the semiconductor substrate 40 of the semiconductor device 1A or 1B.

The third layer 30 of the semiconductor device 1A or 1B is electrically connected, for example, to a source electrode of a transistor formed on or in the semiconductor substrate 40. The wiring 70 of the semiconductor device 1A or 1B is set at a ground (GND) potential, for example. In this case, the source electrode of the transistor is connected to GND via the third layer 30 electrically connected to the source electrode, the via wiring 60, and the wiring 70. This structure in which the source electrode of the transistor is connected to GND via the via wiring 60 is one structure that achieves reduction of the source inductance and that is effective in improving the high frequency characteristics of the transistor.

Figure 5:
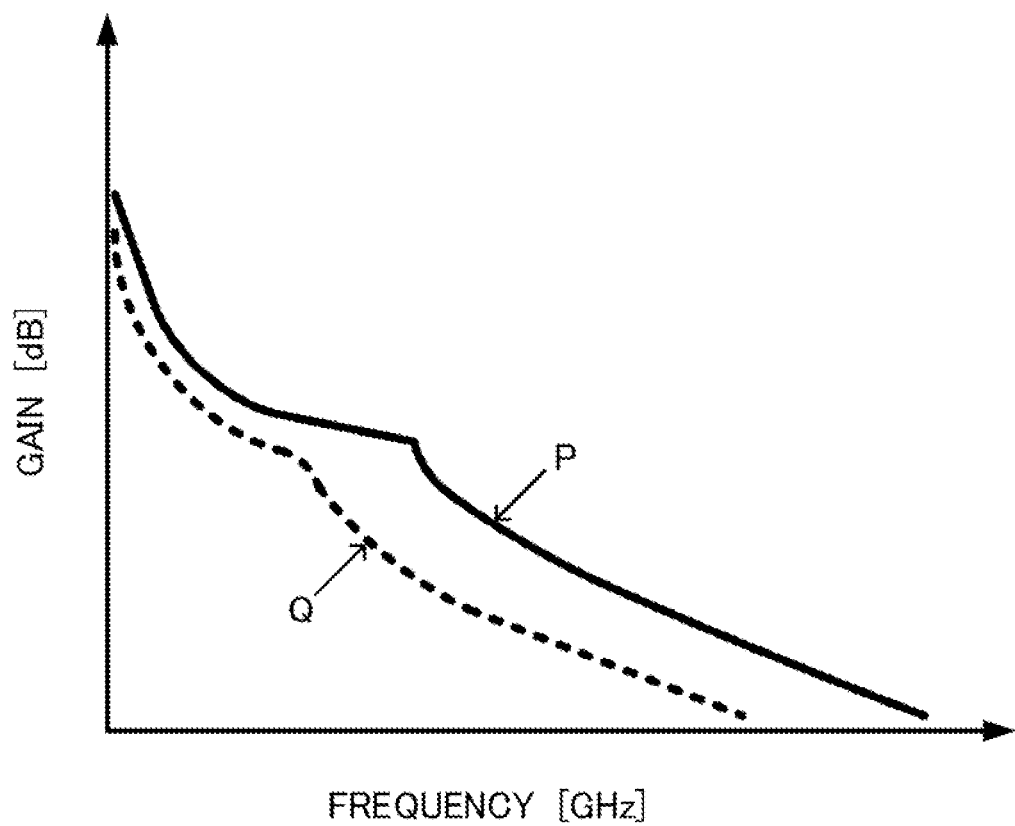
FIG. 5 illustrates an example of a relationship between the frequency and the gain of a transistor.

FIG. 5 illustrates an example of a relationship between the frequency and the gain of a transistor.

In FIG. 5, the horizontal axis represents frequency [GHz] and the vertical axis represents gain [dB)]. In FIG. 5, a solid line P represents an example of a relationship between the frequency and the gain when the source electrode of the transistor is connected to GND via the via wiring 60 formed to pass through the semiconductor substrate 40. In FIG. 5, for comparison, a dotted line Q represents an example of a relationship between the frequency and the gain when the source electrode of the transistor is connected to GND without the via wiring 60 formed to pass through the semiconductor substrate 40.

As illustrated in FIG. 5, the GND connection (solid line P) of the transistor via the via wiring 60 archives a better gain in a wider frequency range and in a higher frequency than the GND connection (dotted line Q) of the transistor without the via wiring 60. For example, if side etching occurs on the first layer 1000 and the via wiring 60 is disconnected as illustrated in FIGS. 2 and 4, the transistor represents the characteristics represented by the GND connection (dotted line Q) of the transistor without the via wiring 60 as illustrated in FIG. 5 or the characteristics similar thereto. In the case of the semiconductor device 1A illustrated in FIG. 1 or the semiconductor device 1B illustrated in FIG. 3, side etching on the first layer 10 is prevented. Thus, since disconnection of the via wiring 60 is prevented, the GND connection (solid line P) of the transistor via the via wiring 60 is achieved, and the characteristics of the transistor are improved.

Second Embodiment

Semiconductor devices achieving high output characteristics or high frequency characteristics are used in the fields relating to radars, radio communications, microwave heating, etc. HEMTs using GaN-based nitride semiconductor as devices operating with a high withstand voltage and at high speed are expected to be applied to millimeter wave band radar systems, radio communication base station systems, microwave heating systems, etc. from their physical properties. For these HEMTs, much effort has been made, for example, to reduce the power consumption and the heat generation amount, increase the output, and improve the high frequency characteristics.

Figure 6:
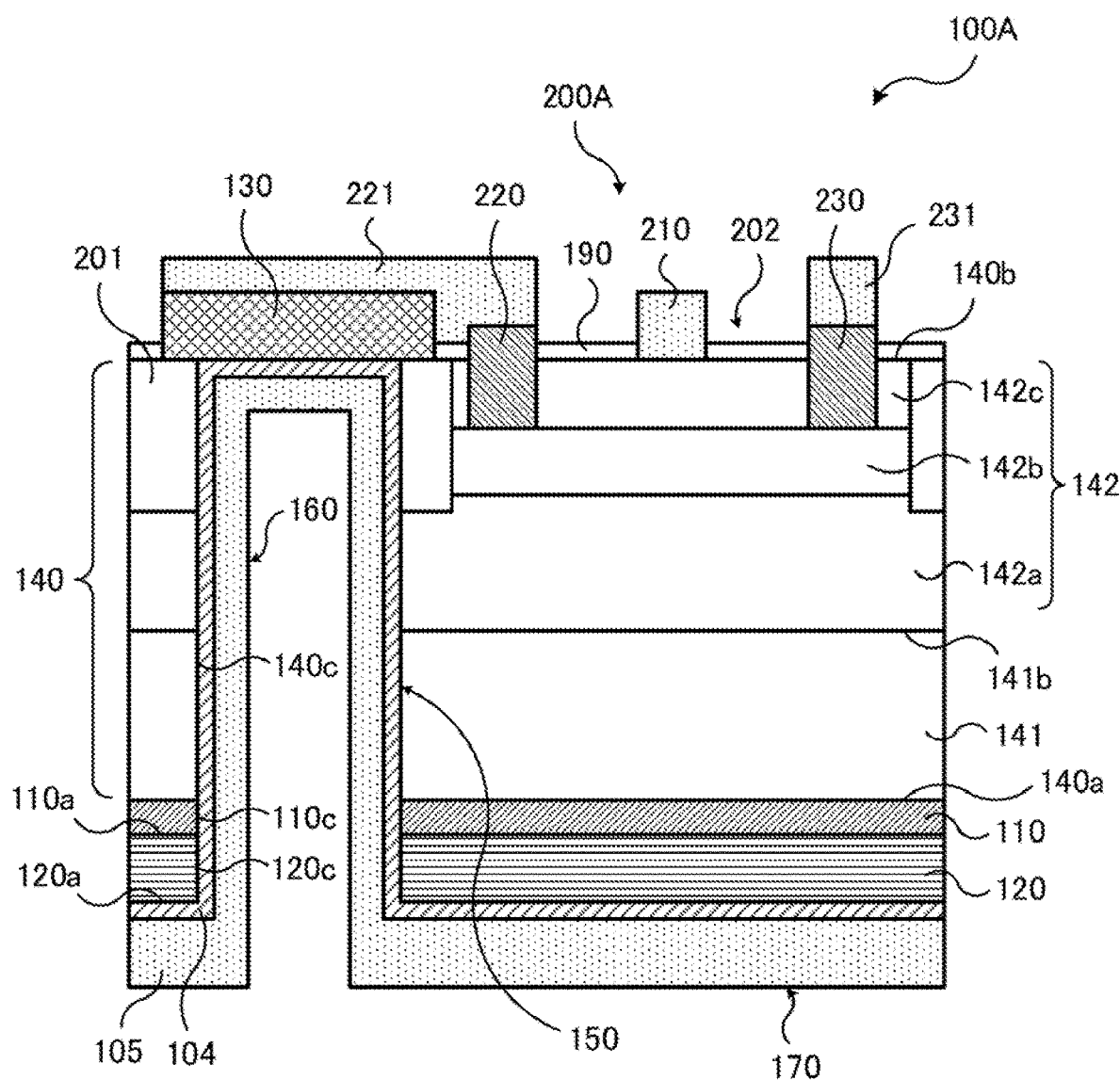
FIG. 6 is a sectional view of an example of a semiconductor device according to a second embodiment.
Figure 7A:
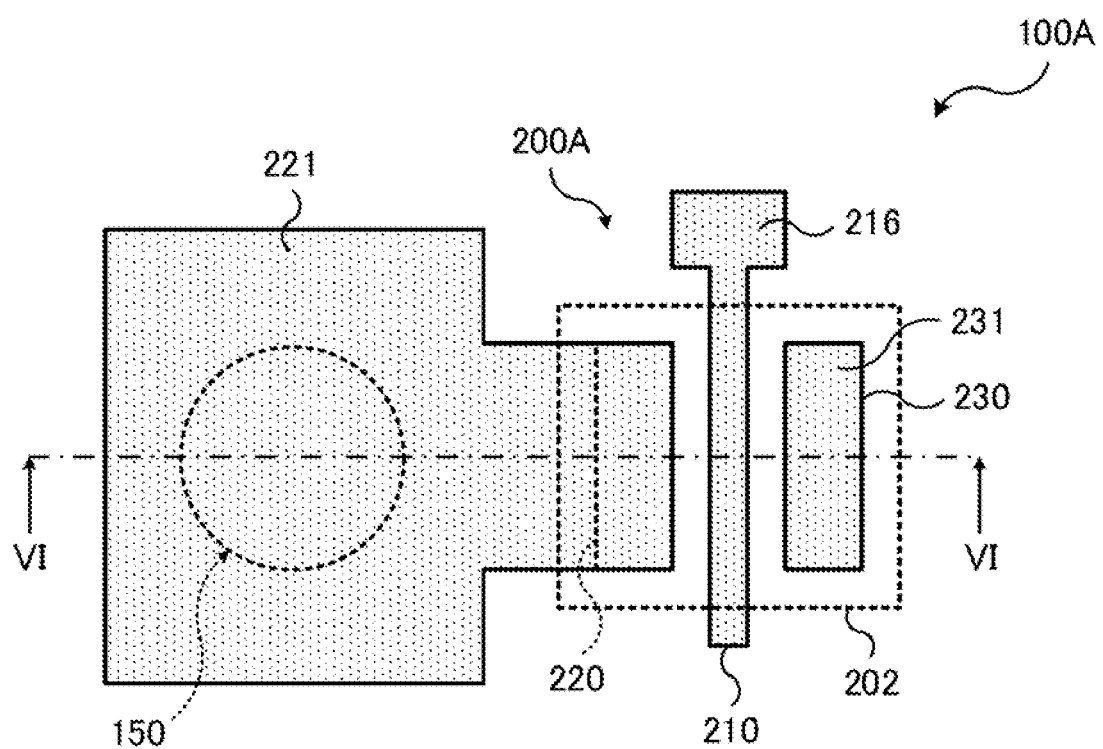
FIGS. 7A and 7B are first and second plan views, each of which illustrates the example of the semiconductor device according to the second embodiment.
Figure 7B:
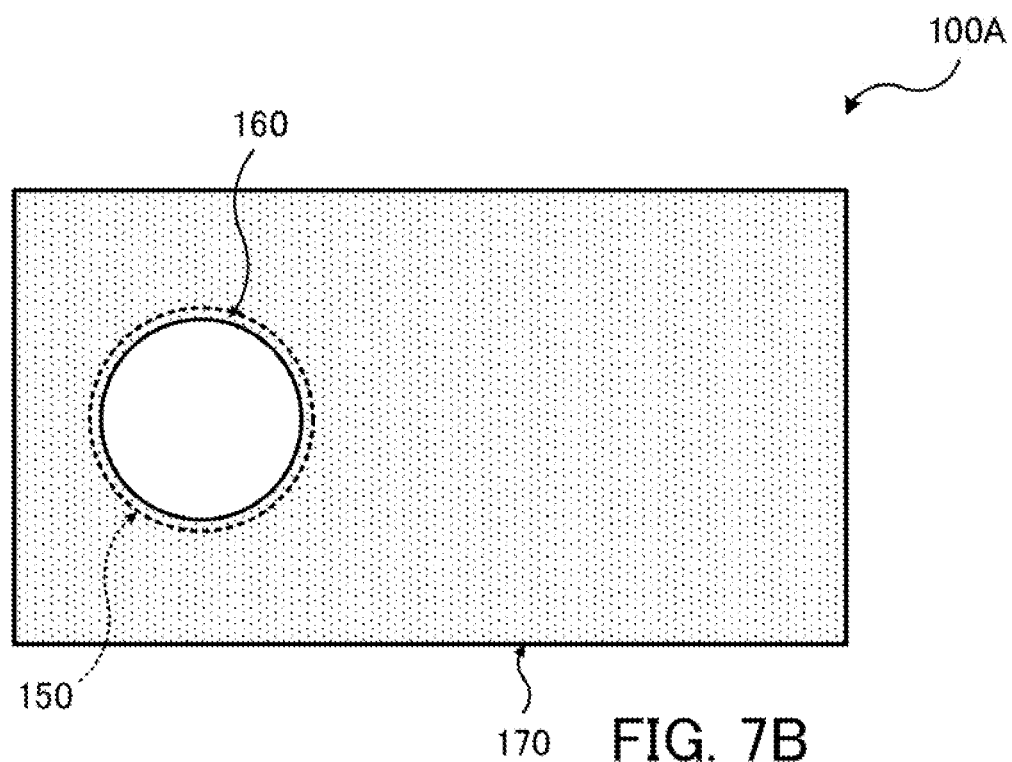

FIG. 6 and FIGS. 7A and 7B illustrate an example of a semiconductor device according to a second embodiment. More specifically, FIG. 6 is a schematic cross section of a main portion of an example of a semiconductor device according to a second embodiment. FIG. 7A is a schematic plan view of the main portion of the example of the semiconductor device according to the second embodiment, seen from a surface where a transistor is formed. FIG. 7B is a schematic plan view of the main portion of the example of the semiconductor device according to the second embodiment, seen from a surface opposite to the surface where the transistor is formed.

This semiconductor device 100A illustrated in FIG. 6 and FIGS. 7A and 7B is an example of a HEMT. As illustrated in FIG. 6, the semiconductor device 100A includes a semiconductor substrate 140, a transistor 200A, a seed layer 110, a mask layer 120, an etching stopper layer 130, a passivation film 190, a via hole 150, a via wiring 160, and a wiring 170.

FIG. 7A is a schematic plan view illustrating a layout of a gate electrode 210, a source electrode 220, a drain electrode 230, a source wiring 221, and a drain wiring 231 of the transistor 200A and a layout of the via hole 150. FIG. 7B is a schematic plan view illustrating a layout of the via hole 150, the via wiring 160, and the wiring 170. FIG. 6 is a schematic cross section taken along a line VI-VI in FIG. 7A.

A structure of the semiconductor device 100A will be described mainly with reference to FIG. 6.

The semiconductor substrate 140 includes a GaN substrate 141 and a GaN-based epitaxial layer 142 stacked thereon. The transistor 200A is formed in an element region (also referred to as "an active region") 202 defined by an element isolation region (also referred to as "an inactive region") 201 of the GaN-based epitaxial layer 142 of the semiconductor substrate 140. The inactive region 201 is formed by injecting ions, such as argon (Ar), to a predetermined region of the GaN-based epitaxial layer 142. The passivation film 190 is formed to cover a surface 140b of the GaN-based epitaxial layer 142 of the semiconductor substrate 140, the GaN-based epitaxial layer 142 including the transistor 200A.

The GaN-based epitaxial layer 142 includes, for example, a channel layer 142a, a barrier layer 142b, and a cap layer 142c. GaN-based nitride semiconductor, e.g., GaN, is used for the channel layer 142a. The channel layer 142a is also referred to as an electron transport layer. GaN-based nitride semiconductor, e.g., AlGaN, having a larger band gap than that of the GaN-based nitride semiconductor used for the channel layer 142a is used for the barrier layer 142b. The barrier layer 142b is also referred to as an electron supply layer. Two dimensional electron gas (2DEG) is generated near the joint interface between the channel layer 142a and the barrier layer 142b by the spontaneous polarization of the barrier layer 142b and the piezoelectric polarization that occurs due to the strain attributable to the lattice constant difference between the barrier layer 142b and the channel layer 142a. GaN-based nitride semiconductor, e.g., GaN, is used for the cap layer 142c.

The gate electrode 210 of the transistor 200A is formed on the cap layer 142c of the GaN-based epitaxial layer 142. For example, the source electrode 220 and the drain electrode 230 of the transistor 200A are formed such that these electrodes 220 and 230 pass through the cap layer 142c and are connected to the barrier layer 142b. The gate electrode 210 is formed between the source electrode 220 and the drain electrode 230. Predetermined metal is used for the gate electrode 210, the source electrode 220, and the drain electrode 230. The gate electrode 210 is formed on the cap layer 142c such that the gate electrode 210 serves as a Schottky electrode, and the source electrode 220 and the drain electrode 230 are formed on the barrier layer 142b such that these electrodes 220 and 230 serve as ohmic electrodes. The gate electrode 210 is provided with a gate pad portion 216 (FIG. 7A). The source electrode 220 and the drain electrode 230 are connected to the source wiring 221 and the drain wiring 231, respectively. Predetermined metal is used for the source wiring 221 and the drain wiring 231.

When the semiconductor device 100A operates, a predetermined voltage is applied across the source electrode 220 and the drain electrode 230, and a predetermined gate voltage is applied to the gate electrode 210. A channel through which carrier electrons are transported is formed in the channel layer 142a between the source electrode 220 and the drain electrode 230, and the semiconductor device 100A consequently realizes a transistor function.

In the case of the semiconductor device 100A, the GaN-based epitaxial layer 142 provided with the transistor 200A is grown on a surface 141b of the GaN substrate 141 by using a metal organic chemical vapor deposition (MOCVD), a metal organic vapor phase epitaxy (MOVPE), or a molecular beam epitaxy (MBE), for example.

In one known technique, the GaN-based epitaxial layer 142 is grown on a SiC substrate, a Si substrate, a sapphire substrate, or the like. A SiC substrate or the like used in such a technique relatively easily causes a lattice mismatch with the GaN-based epitaxial layer 142 grown on the SiC substrate or the like. Thus, a crystal defect or the like attributable to such a lattice mismatch with the SiC substrate or the like occurs relatively easily within the GaN-based epitaxial layer 142. Such a crystal defect or the like that occurs in this way could result in an electronic trap, cause a current collapse, and deteriorate the output of the transistor 200A and the characteristics of the transistor 200A such as the electron transport efficiency.

In contract, in the case of the above semiconductor device 100A, the GaN-based epitaxial layer 142 is grown on the GaN substrate 141. The GaN substrate 141 is easily lattice-matched with the GaN-based epitaxial layer 142 with a low dislocation. Thus, since a crystal defect or the like does not occur relatively easily in the GaN-based epitaxial layer 142, a current collapse is prevented. In this respect, use of the GaN substrate 141 as the base substrate on which the GaN-based epitaxial layer 142, which is a semiconductor layer, is grown is effective in improving the characteristics of the transistor 200A.

It is preferable that, in view of reducing the source inductance, the source electrode 220 of the transistor 200A be connected to GND via the via wiring (also referred to as "a through hole wiring") that passes through the semiconductor substrate 140 (the GaN-based epitaxial layer 142 and the GaN substrate 141). A GND connection technique relating to a through hole wiring has already been used in a mode in which a SiC substrate or the like is used as the base substrate of the GaN-based epitaxial layer 142. Thus, it is preferable that such a technique also be applied to a mode, such as the above semiconductor device 100A, in which the GaN substrate 141 is used as the base substrate.

In the case of the semiconductor device 100A, the seed layer 110 is formed on a surface 140a of the GaN substrate 141 of the semiconductor substrate 140. The mask layer 120 is formed on a surface 110a of the seed layer 110, the surface 110a being opposite to the GaN substrate 141. The etching stopper layer 130 is formed on the surface 140b of the GaN-based epitaxial layer 142 of the semiconductor substrate 140. The via hole 150 is formed to pass through the mask layer 120, the seed layer 110, and the semiconductor substrate 140 from the surface 140a to the surface 140b and to reach the etching stopper layer 130.

The via wiring 160 is formed on the inner surface of the via hole 150, that is, on the inner surface of an opening portion 120c of the mask layer 120, the inner surface of an opening portion 110c of the seed layer 110, the opening portion 110c being connected to the opening portion 120c, and the inner surface of an opening portion 140c of the semiconductor substrate 140, the opening portion 140c being connected to the opening portion 110c. The via wiring 160 is connected to the etching stopper layer 130 formed on the surface 140b of the semiconductor substrate 140. The wiring 170 is formed on a surface 120a of the mask layer 120, the surface 120a being opposite to the seed layer 110, such that the wiring 170 continues from the via wiring 160 formed on the inner surface of the via hole 150. In FIG. 6, the via wiring 160 and the wiring 170 each has a multi-layer structure of a seed layer 104 and a conductor layer 105 formed thereon, and in the multi-layer structure, the portion formed on the inner surface of the via hole 150 serves as the via wiring 160, and the portion formed on the surface 120a of the mask layer 120 serves as the wiring 170.

In the case of the semiconductor device 100A, an Au-containing layer, for example, an Au layer or a layer containing Au as its main component, is used as the seed layer 110 formed on the surface 140a of the semiconductor substrate 140. An Ni-containing layer, for example, an Ni layer or a layer containing Ni as its main component, is used as the mask layer 120 formed on the surface 110a of the seed layer 110. In addition, a metal layer, for example, an Ni-containing layer, is used as the etching stopper layer 130 formed on the surface 140b of the semiconductor substrate 140. Metal material, for example, material containing Au, is used for the via wiring 160 and the wiring 170. For example, a multi-layer structure of titanium (Ti) and Au (Ti—Au multi-layer structure) is used for the seed layer 104 of the via wiring 160 and the wiring 170, and an Au layer is used as the conductor layer 105.

The mask layer 120 of the semiconductor device 100A serves as a mask when the semiconductor substrate 140 is etched to form the opening portion 140c. The seed layer 110 serves as a base layer when the mask layer 120 is formed on the surface 140a of the semiconductor substrate 140. For example, when the semiconductor substrate 140 having a thickness of approximately 100 μm is etched, a relatively thick mask having at least approximately a few μm is used in view of reduction of the layer thickness by the etching. Thus, when the mask layer 120 containing Ni is formed, an electroplating method is used. Use of an electroplating method makes it easier to form a thick layer than use of a deposition method, a sputtering method, or the like. In addition, with an electroplating method, a layer having lower stress is formed. The seed layer 110 serves as a seed layer when the mask layer 120 is formed in accordance with such an electroplating method.

The etching stopper layer 130 of the semiconductor device 100A is connected to the source electrode 220 of the transistor 200A via the source wiring 221. The wiring 170 is set to a GND potential, for example. The source electrode 220 of the transistor 200A is connected to GND via the source wiring 221, the etching stopper layer 130, the via wiring 160, and the wiring 170. By connecting the source electrode 220 of the transistor 200A to GND via the via wiring 160, the source inductance is reduced, and the characteristics of the transistor 200A are improved.

In the case of the semiconductor device 100A, an Au-containing layer is used as the seed layer 110, which is the base layer of the mask layer 120. In this way, when the semiconductor substrate 140 including the GaN substrate 141 and the GaN-based epitaxial layer 142 is etched by using Cl-based gas while using the mask layer 120 containing Ni as a mask, occurrence of side etching on the seed layer 110 is prevented. This is because the seed layer 110, which is an Au-containing layer, has a relatively high etching resistance with respect to Cl-based gas. By preventing occurrence of side etching on the seed layer 110, forming of a stepped portion on the seed layer 110 at the inner surface of the via hole 150 is prevented, and disconnection of the via wiring 160 to be formed on the inner surface of the via hole 150 is prevented.

Since disconnection of the via wiring 160 is prevented, the source electrode 220 of the transistor 200A is connected to the wiring 170 set to the GND potential via the source wiring 221, the etching stopper layer 130, and the via wiring 160. That is, the source electrode 220 is connected to GND. As a result, GND connection is achieved by the through hole wiring, and the high performance semiconductor device 100A including the transistor 200A having a low source inductance and excellent characteristics in obtained.

Next, a manufacturing method of the semiconductor device 100A having the above configuration will be described.

FIGS. 8A to 12B illustrate an example of a manufacturing method of the semiconductor device according to the second embodiment. More specifically, FIGS. BA to 12B are each a schematic cross section of a main portion of the semiconductor device according to the second embodiment in an example of a step of a manufacturing method of the semiconductor device.

First, a structure 101A as illustrated in FIG. BA is prepared. The structure 101A is an example of a basic structure of the semiconductor device 100A before the via hole 150, the via wiring 160, and the wiring 170 as described above are formed.

For example, the structure 101A has a structure in which the GaN channel layer 142a, the AlGaN barrier layer 142b, and the GaN cap layer 142c forming the GaN-based epitaxial layer 142 are sequentially grown on the surface 141b of the semi-insulating GaN substrate 141 having a thickness of 350 μm by using a MOVPE method, for example. A GaN layer doped with iron (Fe) may be inserted between the GaN substrate 141 and the channel layer 142a.

Regarding the growing of the individual layers by using the MOVPE method, a mixed gas of tri-methyl-gallium (TMGa), which serves as the Ga source, and ammonia (NH$_3$) is used to grow GaN. In addition, a mixed gas of tri-methyl-aluminum (TMAl), which serves as the Al source, TMGa, and NH$_3$ is used to grow AlGaN. Depending on the nitride semiconductor to grow, the supply and stoppage (switching) of TMGa and TMAl and the flow amounts used when these materials are supplied (mixing ratio with respect to the other materials) are suitably set. In addition, depending on the nitride semiconductor to grow, the growth pressure and the growth temperature are suitably set.

After the GaN-based epitaxial layer 142 is grown, Ar ions or the like are injected to form the inactive region (element isolation region) 201. After recesses that pass through the cap layer 142c and reach the barrier layer 142b are formed, the source electrode 220 and the drain electrode 230 are formed by using a photolithography technique, a deposition technique, and a liftoff technique. In addition, the gate electrode 210 is formed also by using a photolithography technique, a deposition technique, and a liftoff technique. The passivation film 190 containing silicon nitride (SiN) is formed on the surface 140b of the semiconductor substrate 140 by using a plasma chemical vapor deposition (CVD) method or the like.

Next, a resist pattern for processing a region where the etching stopper layer 130 is to be formed is formed, and dry-etching is performed on the passivation film 190 by using a mixed gas of $SF_6$ and $CHF_3$. After the resist is removed, to electroplate Ni that is to serve as the etching stopper layer 130, a multi-layer structure of Ti and Au is formed as a seed layer by using a sputtering method, for example. Next, on top of the seed layer, a resist pattern having an opening portion at the region where the etching stopper layer 130 is to be formed is formed. By using the seed layer as a feed layer, an Ni-electroplated layer is formed. Next, the resist is removed, and the seed layer exposed thereafter is removed by ion milling, for example. As a result, the etching stopper layer 130 having a multi-layer structure of the seed layer, which is a multi-layer structure of Ti and Au, and the Ni-electroplated layer is formed. In this example, for convenience, the etching stopper layer 130 is schematically illustrated as a single layer.

Next, for example, a multi-layer structure of Ti, platinum (Pt), and Au (Ti—Pt—Au multi-layer structure) is formed as a seed layer by using a sputtering method, and a resist pattern having opening portions at the regions where the source wiring 221 and the drain wiring 231 are to be formed is formed on the multi-layer structure. By using the seed layer as a feed layer, an Au-electroplated layer is formed. After the resist is removed, the seed layer exposed thereafter is removed by ion milling, for example. As a result, the source wiring 221 and the drain wiring 231 having a multi-layer structure of the seed layer, which is a Ti—Pt—Au multi-layer structure, and the Au-electroplated layer are formed. The source wiring 221 is formed to connect to the etching stopper layer 130. In this example, for convenience, the source wiring 221 and the drain wiring 231 are each schematically illustrated as a single layer.

Through these steps as described above, the structure 101A as illustrated in FIG. 8A is obtained. The structure 101A is a basic structure of the semiconductor device 100A and includes the transistor 200A.

Figure 8A:
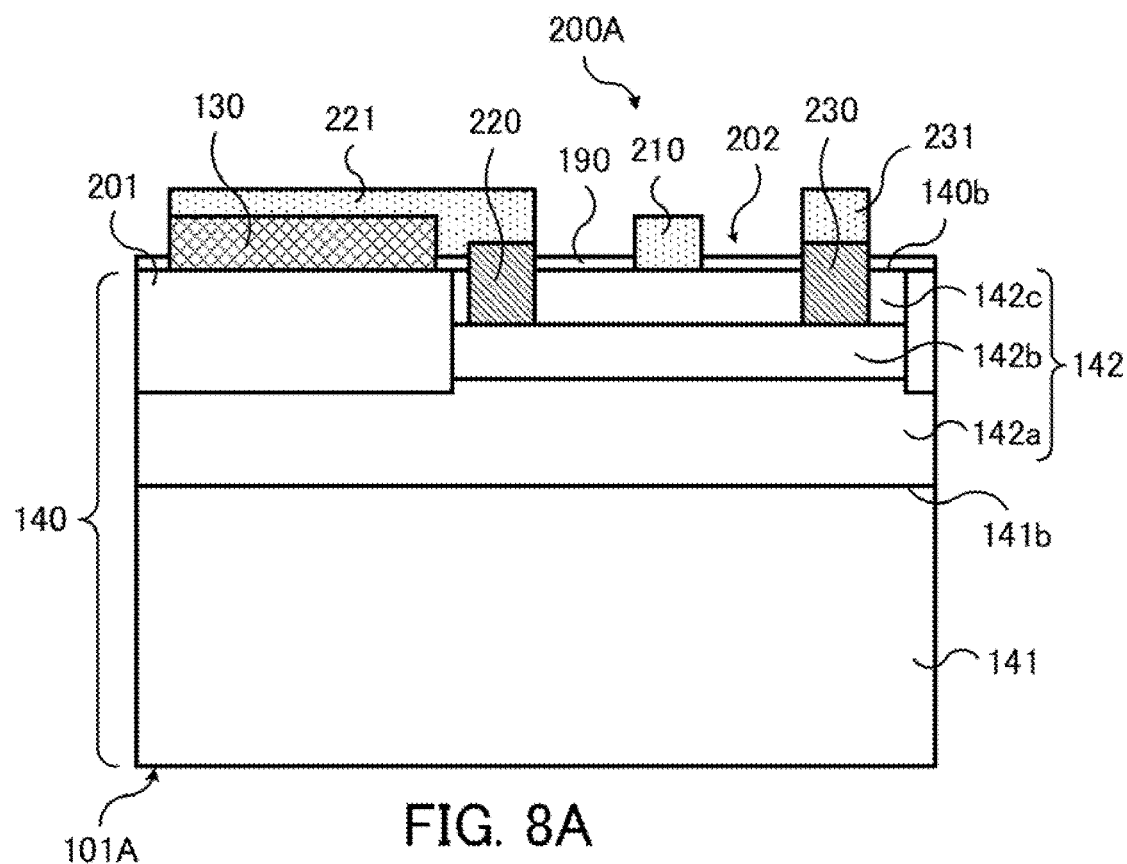
FIGS. 8A and 8B are first and second sectional views, each of which illustrates an example of a semiconductor device manufacturing method according to the second embodiment.
Figure 8B:
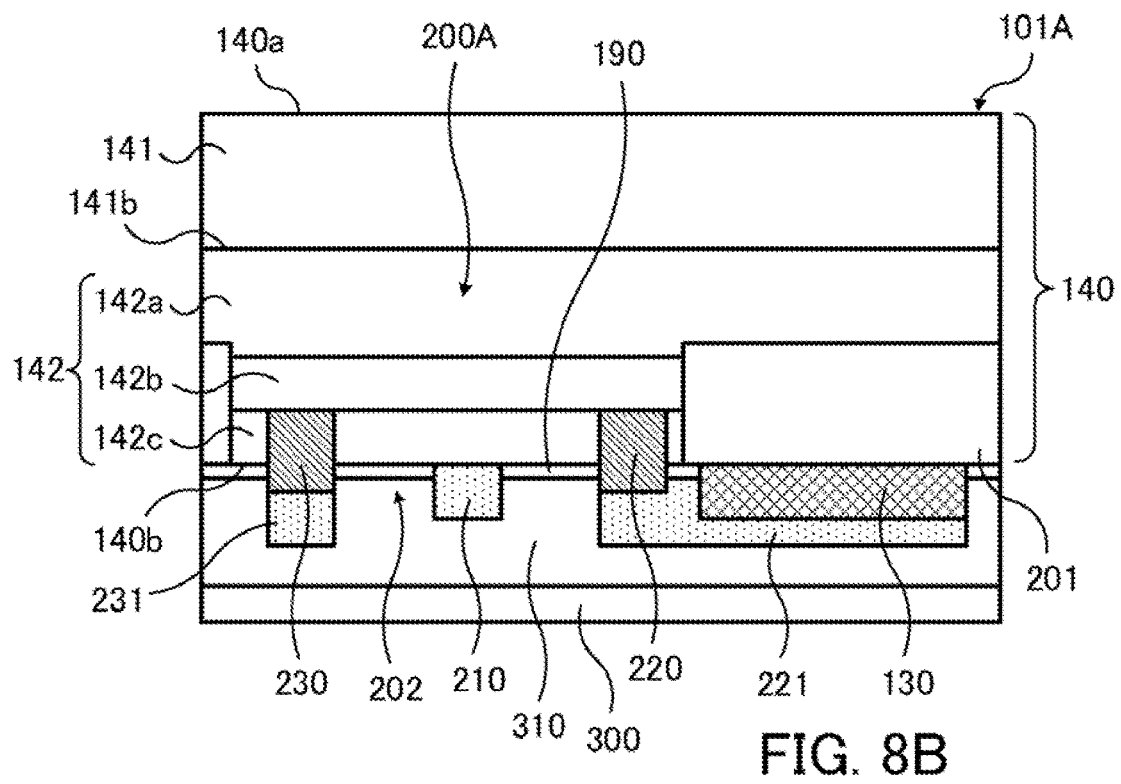

In the case of the obtained structure 101A, thermoplastic adhesive 310 is applied to the surface on which the transistor 200A is formed, as illustrated in FIG. 8B. Next, a support plate 300 is bonded to the thermoplastic adhesive 310. Next, a surface of the GaN substrate 141, the surface being opposite to the surface on which the transistor 200A is formed, is ground and polished. In this way, the GaN substrate 141 is thinned to a thickness of approximately 100 µm.

Figure 9A:
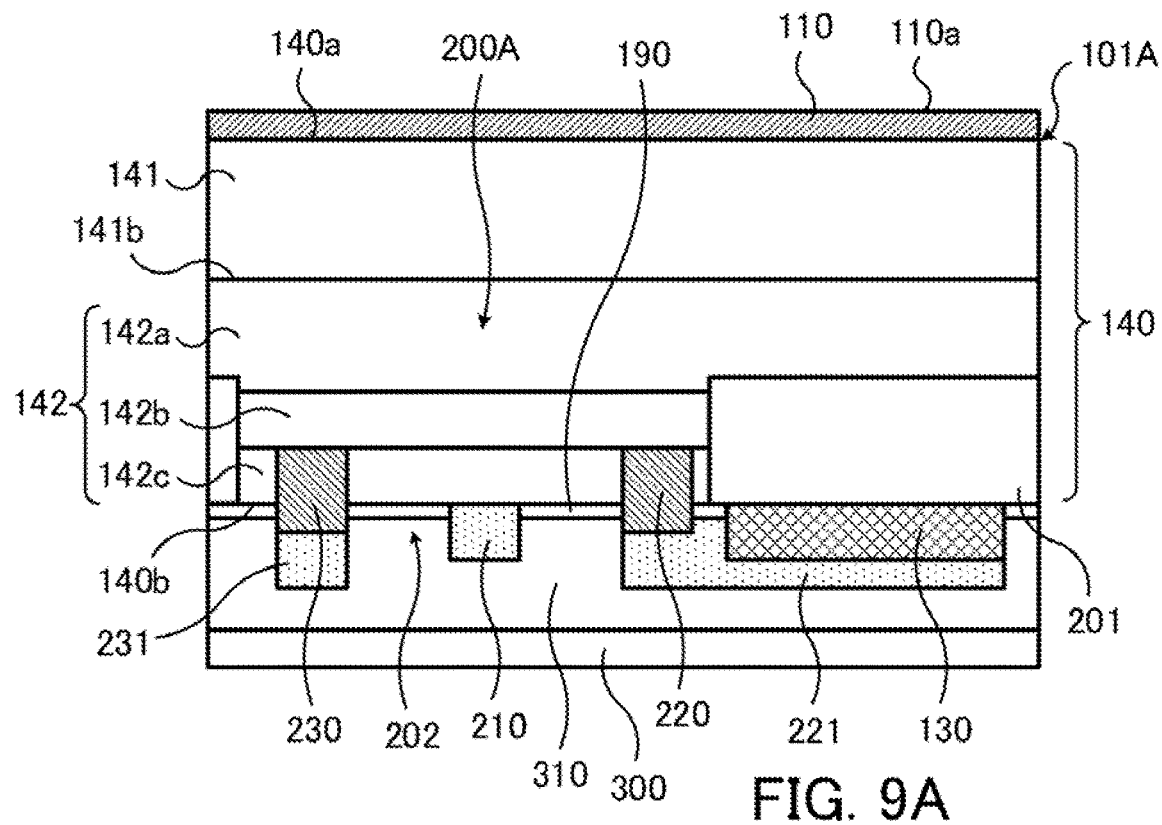
FIGS. 9A and 9B are third and fourth sectional views, each of which illustrates the example of the semiconductor device manufacturing method according to the second embodiment.
Figure 9B:
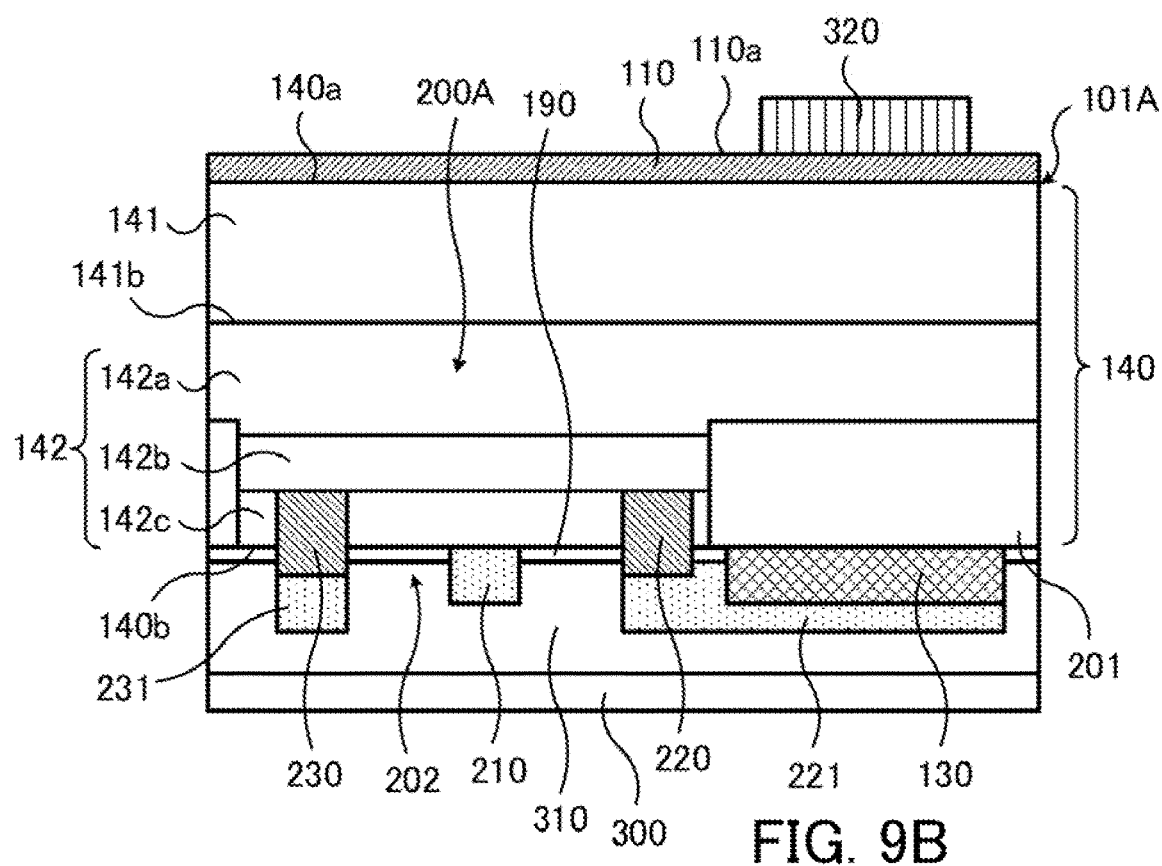

Next, as illustrated in FIG. 9A, the seed layer 110, which is a multi-layer structure of Ti and Au, is formed on the surface of the thinned GaN substrate 141, that is, on the surface 140a of the semiconductor substrate 140, by using a sputtering method, for example. In this example, the seed layer 110 contains Au as its main component. For example, the seed layer 110 having a multi-layer structure of a Ti layer having a thickness of approximately 10 nm to 30 nm and an Au layer having a thickness of approximately 200 nm to 400 nm is formed. After the seed layer 110 is formed, as illustrated in FIG. 9B, resist 320 is formed on the surface 110a of the formed seed layer 110 such that the resist 320 covers the portion corresponding to the region where the via hole 150 is to be formed. The diameter of the formed resist 320 (corresponding to the diameter of the via hole 150 to be formed) is, for example, 80 µm.

Figure 10A:
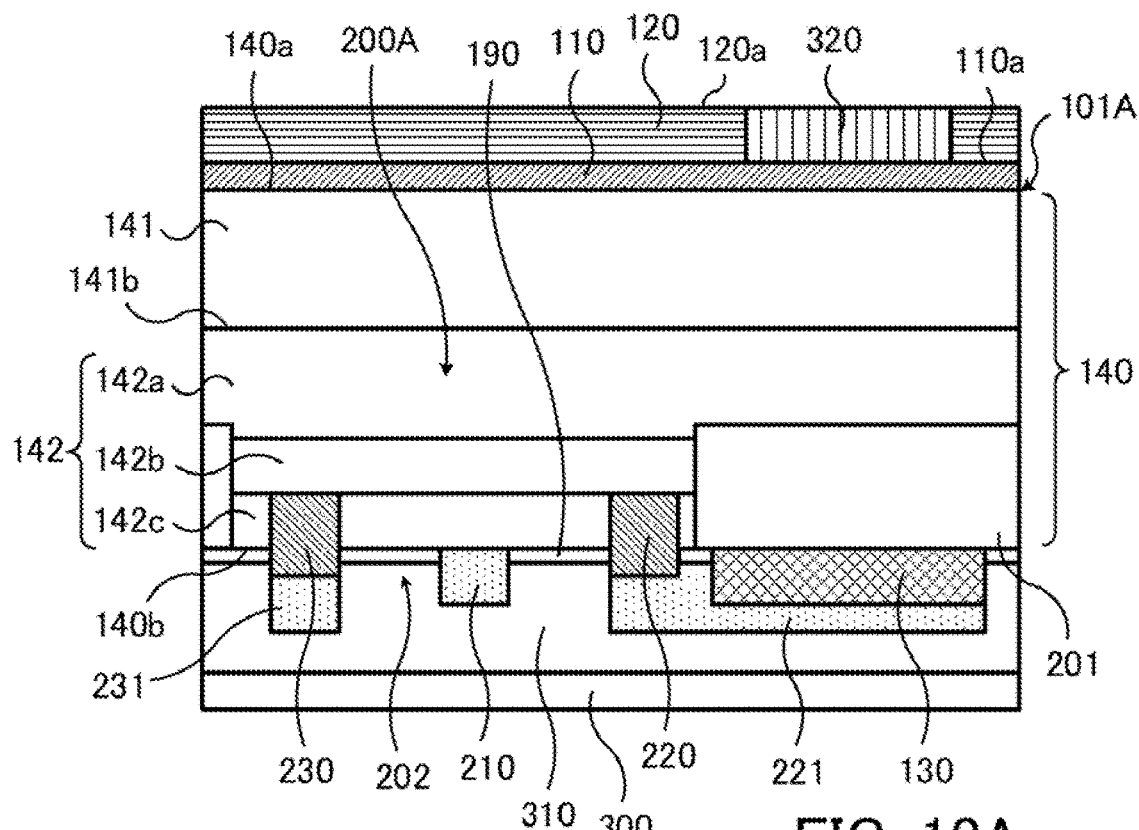
FIGS. 10A and 10B are fifth and sixth sectional views, each of which illustrates the example of the semiconductor device manufacturing method according to the second embodiment.
Figure 10B:
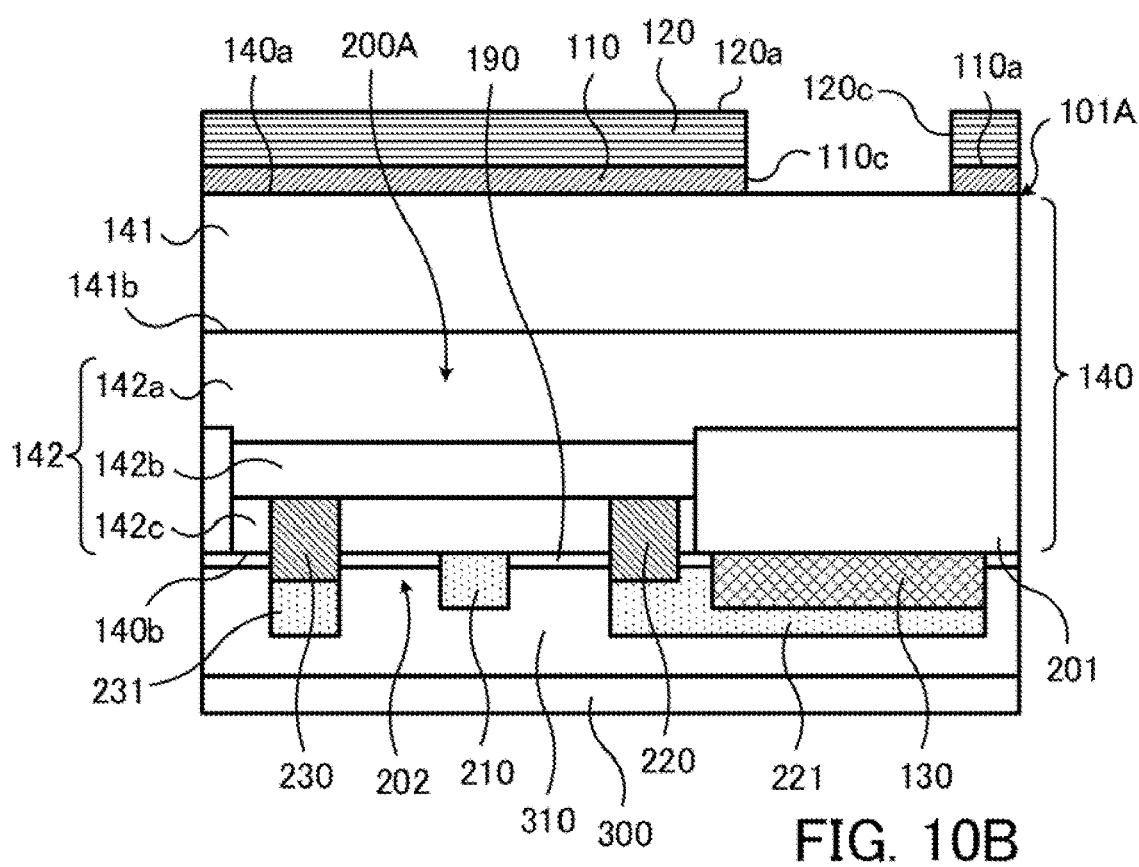

After the resist 320 is formed, as illustrated in FIG. 10A, an Ni-electroplated layer, which is to serve as the mask layer 120, is formed by using the seed layer 110 as a feed layer. Next, as illustrated in FIG. 10B, the resist is removed, and the seed layer 110 exposed thereafter is removed by ion milling, for example. In this way, a structure in which the seed layer 110 having the opening portion 110c and containing Au as its main component is formed as the base layer and the Ni-electroplated layer having the opening portion 120c is formed as the mask layer 120 on the seed layer 110, the opening portion 120c being connected to the opening portion 110c, is obtained.

Figure 11A:
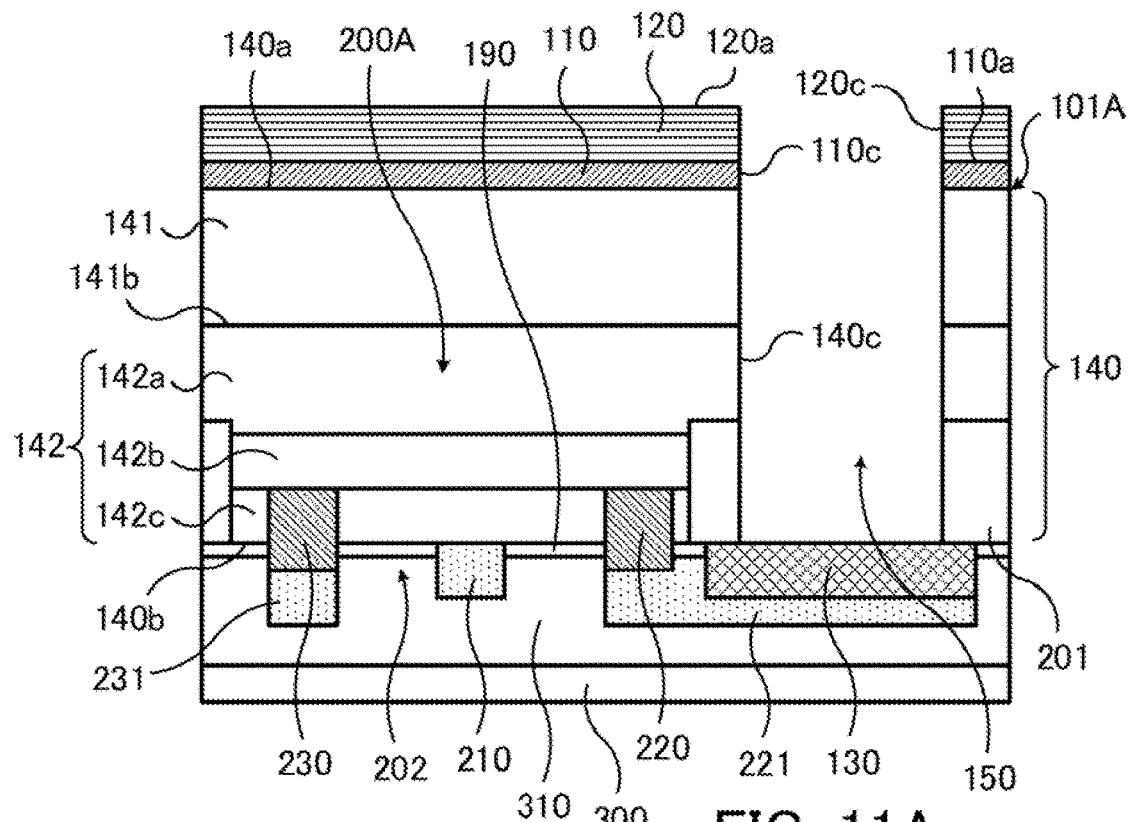
FIGS. 11A and 11B are seventh and eighth sectional views, each of which illustrates the example of the semiconductor device manufacturing method according to the second embodiment.

Next, as illustrated in FIG. 11A, the GaN substrate 141 and the GaN-based epitaxial layer 142 of the semiconductor substrate 140 are etched from the direction of the mask layer 120 by using the mask layer 120 as a mask. ICP etching is performed as this etching by using a mixed gas of $Cl_2$ and $BCl_3$ whose gas ratio is 10%, that is, by using Cl-based gas. This etching is performed under the conditions that the pressure is 2 Pa, the upper electrode power is 2 kW, and the lower electrode power is 0.25 kW. The etching rate of GaN is, for example, 1.5 µm/min. The GaN substrate 141 and the GaN-based epitaxial layer 142 are etched in this order by using the mask layer 120 as a mask under the above conditions. As a result, the opening portion 140c of the semiconductor substrate 140, the opening portion 140c being connected to the opening portion 120c of the mask layer 120 and the opening portion 110c of the seed layer 110, is formed. Consequently, the via hole 150 that passes through the mask layer 120, the seed layer 110, and the semiconductor substrate 140 from the surface 140a to the surface 140b and reaches the etching stopper layer 130 is formed. After the via hole 150 is formed, to prevent erosion by the remaining Cl, the semiconductor device 100A is washed with running pure water.

As described above, Cl-based gas is used for the etching of the GaN substrate 141 and the GaN-based epitaxial layer 142 of the semiconductor substrate 140. When the etching using Cl-based gas is performed, if a layer containing Cu as its main component is used as the seed layer 110, side etching occurs. In contrast, in this example manufacturing method, a layer containing Au as its main component, the layer having a relatively high etching resistance with respect to Cl-based gas, is formed as the seed layer 110. In this way, even when the semiconductor substrate 140 is etched by using Cl-based gas to form the via hole 150, occurrence of side etching on the seed layer 110 is prevented.

Figure 11B:
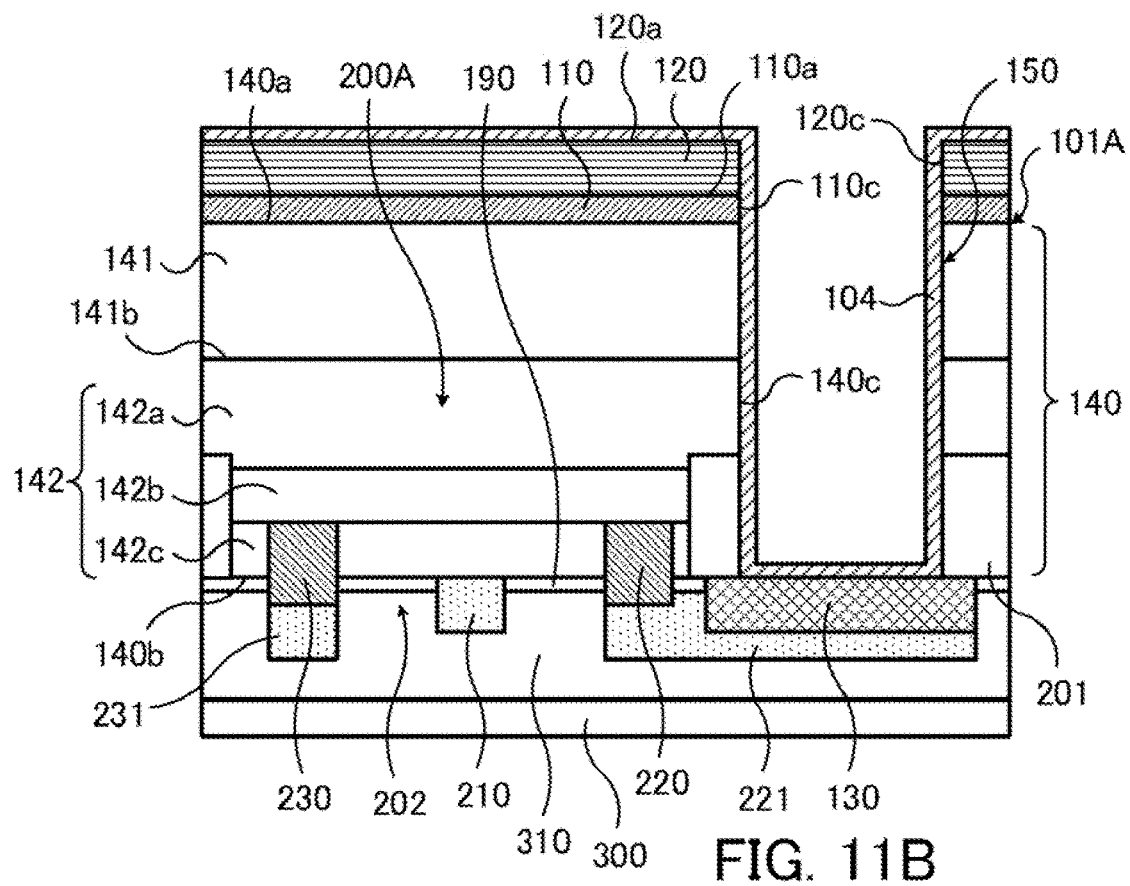
Figure 12A:
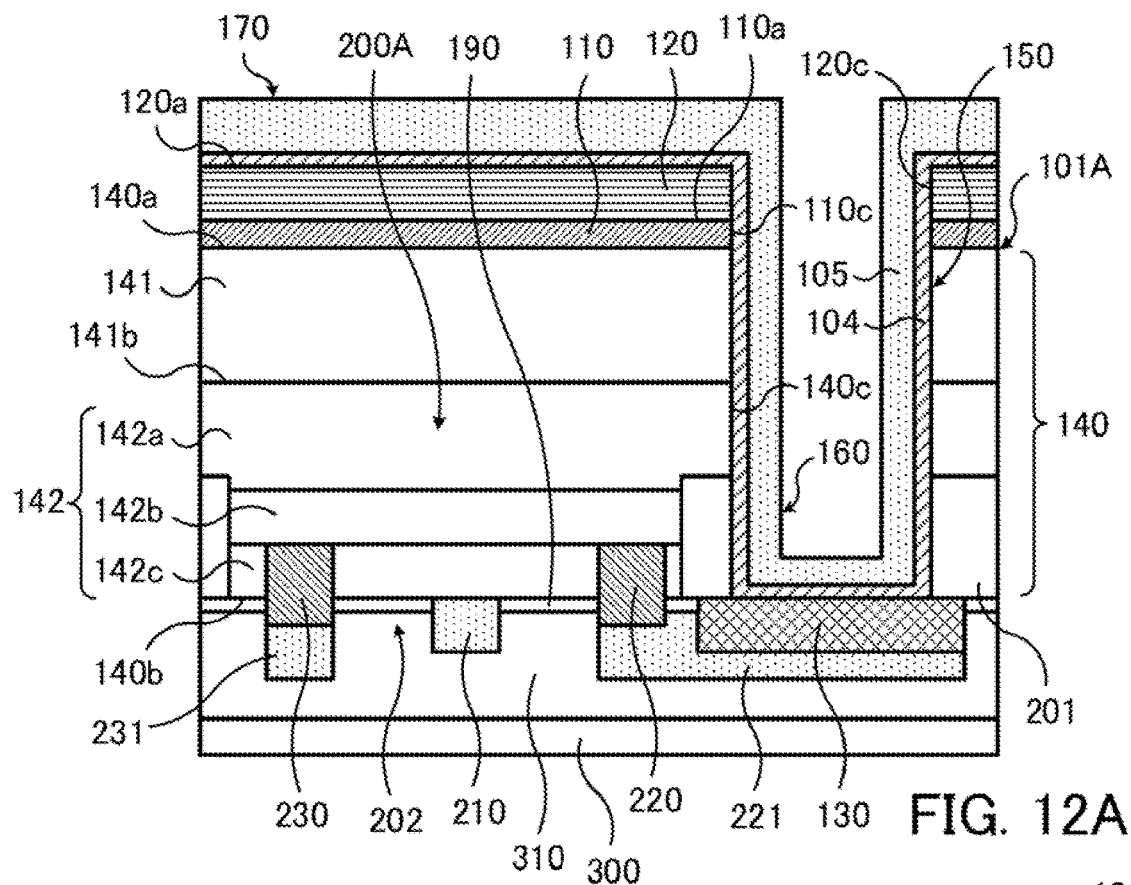
FIGS. 12A and 12B are ninth and tenth sectional views, each of which illustrates the example of the semiconductor device manufacturing method according to the second embodiment.

After the via hole 150 is formed, as illustrated in FIG. 11B, the seed layer 104 is formed on the inner surface of the formed via hole 150, that is, on the inner surface of the opening portion 120c of the mask layer 120, the inner surface of the opening portion 110c of the seed layer 110, and the inner surface of the opening portion 140c of the semiconductor substrate 140. For example, the seed layer 104 having a multi-layer structure of Ti and Au is formed by using a sputtering method, after reverse sputtering. Next, after the seed layer 104 is formed, as illustrated in FIG. 12A, by using the seed layer 104 as a feed layer, an Au-electroplated layer is formed to form the conductor layer 105. In this way, the via wiring 160 is formed on the inner surface of the via hole 150, and the wiring 170 continuing from the via wiring 160 on the inner surface of the via hole 150 is formed on the surface 120a of the mask layer 120.

As described above, in this example manufacturing method, since a layer containing Au as its main component is formed as the seed layer 110, even when etching using Cl-based gas is performed, occurrence of side etching on the seed layer 110 is prevented. Thus, when the seed layer 104 is formed as illustrated in FIG. 11B, the seed layer 104 continuously covers a portion at the seed layer 110 in the via hole 150 along with the other portions. That is, the seed layer 104 is suitably formed at the portion at the seed layer 110. Since the seed layer 104 is suitably formed at the portion at the seed layer 110, when the conductor layer 105 as illustrated in FIG. 12A is formed by using an electroplating method, the conductor layer 105 is formed on the seed layer 104 covering the portion at the seed layer 110 in the via hole 150 continuously with the other portions. In this way, the via wiring 160 whose disconnection due to occurrence of side etching on the seed layer 110 in the via hole 150 is prevented is formed on the inner surface of the via hole 150.

Figure 12B:
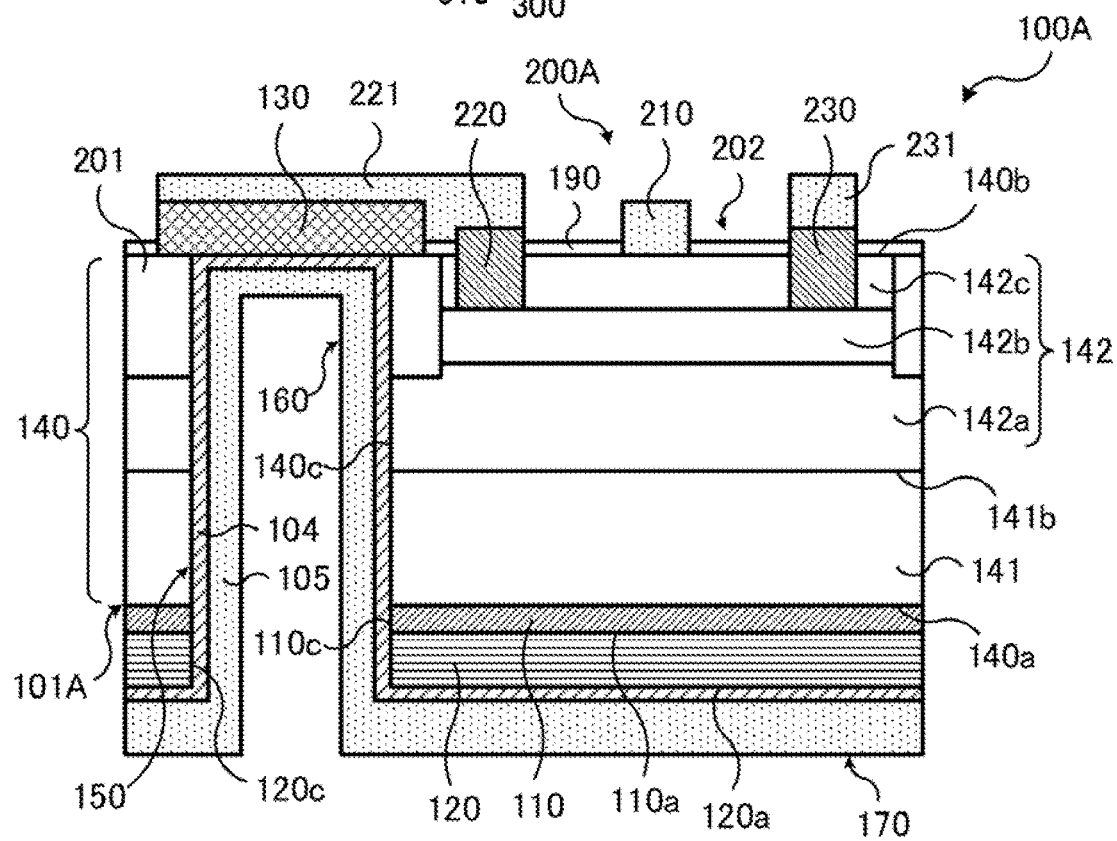

After the via wiring 160 and the wiring 170 are formed, the support plate 300 is peeled off, and the thermoplastic adhesive 310 is removed. In this way, the semiconductor device 100A including the through hole wiring as illustrated in FIG. 12B is obtained.

With the semiconductor device 100A obtained in accordance with this example manufacturing method, when the semiconductor substrate 140 is etched by using Cl-based gas, occurrence of side etching on the seed layer 110 in the via hole 150 is prevented, and disconnection of the via wiring 160 formed after the etching is prevented. In this way, the source electrode 220 of the transistor 200A is connected to the wiring 170 set to the GND potential via the source wiring 221, the etching stopper layer 130, and the via wiring 160. That is, the source electrode 220 is connected to GND. Since the GND connection is made by the through hole wiring, the high performance semiconductor device 100A including the transistor 200A having a low source inductance and excellent characteristics is obtained.

Third Embodiment

Figure 13A:
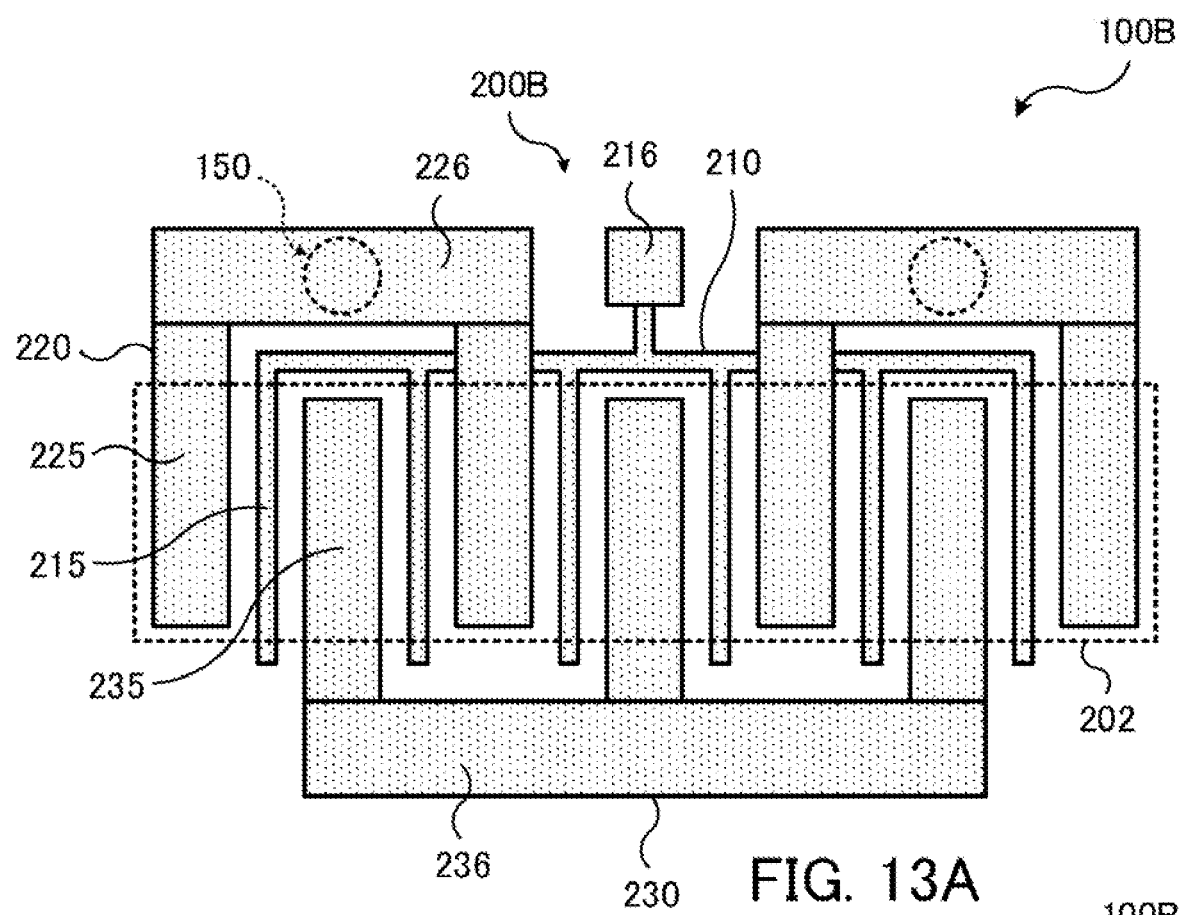
FIGS. 13A and 13B are first and second plan views, each of which illustrates an example of a semiconductor device according to a third embodiment.
Figure 13B:
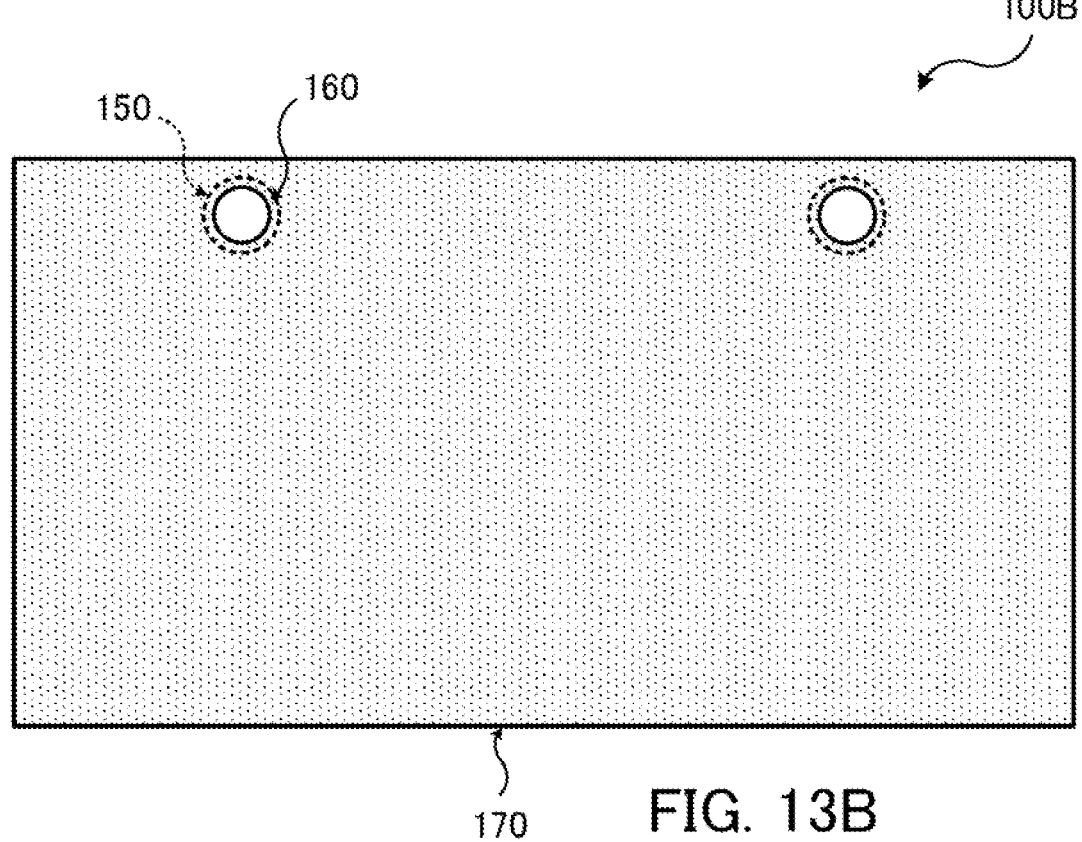

FIGS. 13A and 13B illustrate an example of a semiconductor device according to a third embodiment. More specifically, FIG. 13A is a schematic plan view of a main portion of an example of a semiconductor device according to a third embodiment, seen from a surface where a transistor is formed. FIG. 13B is a schematic plan view of the main portion of the example of the semiconductor device according to the third embodiment, seen from a surface opposite to the surface where the transistor is formed.

This semiconductor device 100B illustrated in FIGS. 13A and 13B includes a transistor 200B having a multi-finger electrode structure.

For example, as illustrated in FIG. 13A, the semiconductor device 100B includes a gate electrode 210, a source electrode 220, and a drain electrode 230 having a comb-teeth shape in a plan view. For example, the source electrode 220 includes a plurality of (for example, four) source finger portions 225, and the drain electrode 230 includes a plurality of (for example, three) drain finger portions 235, each of which is located between two source finger portions 225 adjacent to each other. The gate electrode 210 includes a plurality of (for example, six) gate finger portions 215, each of which is located between a source finger portion 225 and a drain finger portion 235. The gate finger portions 215, the source finger portions 225, and the drain finger portions 235 are formed to be positioned in an active region 202. The plurality of gate finger portions 215 are connected to a shared gate pad portion 216 of the gate electrode 210. A plurality of source finger portions 225 are connected to a shared source pad portion 226 of the source electrode 220, and the plurality of drain finger portions 235 are connected to a shared drain pad portion 236 of the drain electrode 230.

FIG. 13A is a schematic plan view illustrating a layout of the gate electrode 210, the source electrode 220, and the drain electrode 230 of the transistor 200B and a layout of the via hole 150 of the semiconductor device 100B.

A single gate finger portion 215 of the transistor 200B and a source finger portion 225 and a drain finger portion 235 sandwiching the single gate finger portion 215 have the functions corresponding to the gate electrode 210, the source electrode 220, and the drain electrode 230 of the transistor 200A according to the above second embodiment, respectively. An individual region where a single gate finger portion 215 and a source finger portion 225 and a drain finger portion 235 sandwiching the single gate finger portion 215 are formed has the functions corresponding to a single transistor 200A according to the second embodiment.

For example, as illustrated in FIG. 13A, in the case of the semiconductor device 100B having the above multi-finger electrode structure, a via hole 150 and a via wiring 160 on the inner surface thereof are formed at a location corresponding to a source pad portion 226 connected to a plurality of source finger portions 225. As in the above second embodiment, as illustrated in FIG. 13B, a wiring 170 that continues from the individual via wirings 160 on the inner surfaces of the via holes 150 is formed on a surface of the semiconductor device 100B, the surface being opposite to the surface where the transistor 200B in formed.

FIG. 13B is a schematic plan view illustrating a layout of the via holes 150, the via wirings 160, and the wiring 170 of the semiconductor device 100B.

As described above, in the case of the semiconductor device 100B having the above multi-finger electrode structure, the via holes 150 and the via wirings 160 formed on the inner surfaces thereof are formed at locations corresponding to the source pad portions 226. In the case of this semiconductor device 100B, too, the same manufacturing method as that according to the above second embodiment may be used to form the via holes 150 and the via wirings 160 formed on the inner surfaces thereof.

Specifically, an etching stopper layer 130 is formed immediately below each of the source pad portions 226. Next, the via holes 150 are formed at locations corresponding to the etching stopper layers 130, such that the via holes 150 pass through a mask layer 120, a seed layer 110, and a semiconductor substrate 140 and reach their respective etching stopper layers 130. Next, the via wirings 160 are formed on the inner surfaces of their respective via holes 150. Since an Au-containing layer is used as the seed layer 110, side etching is prevented when the semiconductor substrate 140 is etched by using Cl-based gas. As a result, disconnection of the via wirings 160 formed on the inner surfaces of the via holes 150 is prevented. The source pad portions 226 of the transistor 200B are connected to the wirings 170 set to a GND potential via the etching stopper layers 130 immediately below the source pad portions 226 and via the via wirings 160 whose disconnection is prevented. That is, the source pad portions 226 are connected to GND. In this way, the high performance semiconductor device 1008 including the transistor 200B having a low source inductance and excellent characteristics is obtained.

Fourth Embodiment

Figure 14:
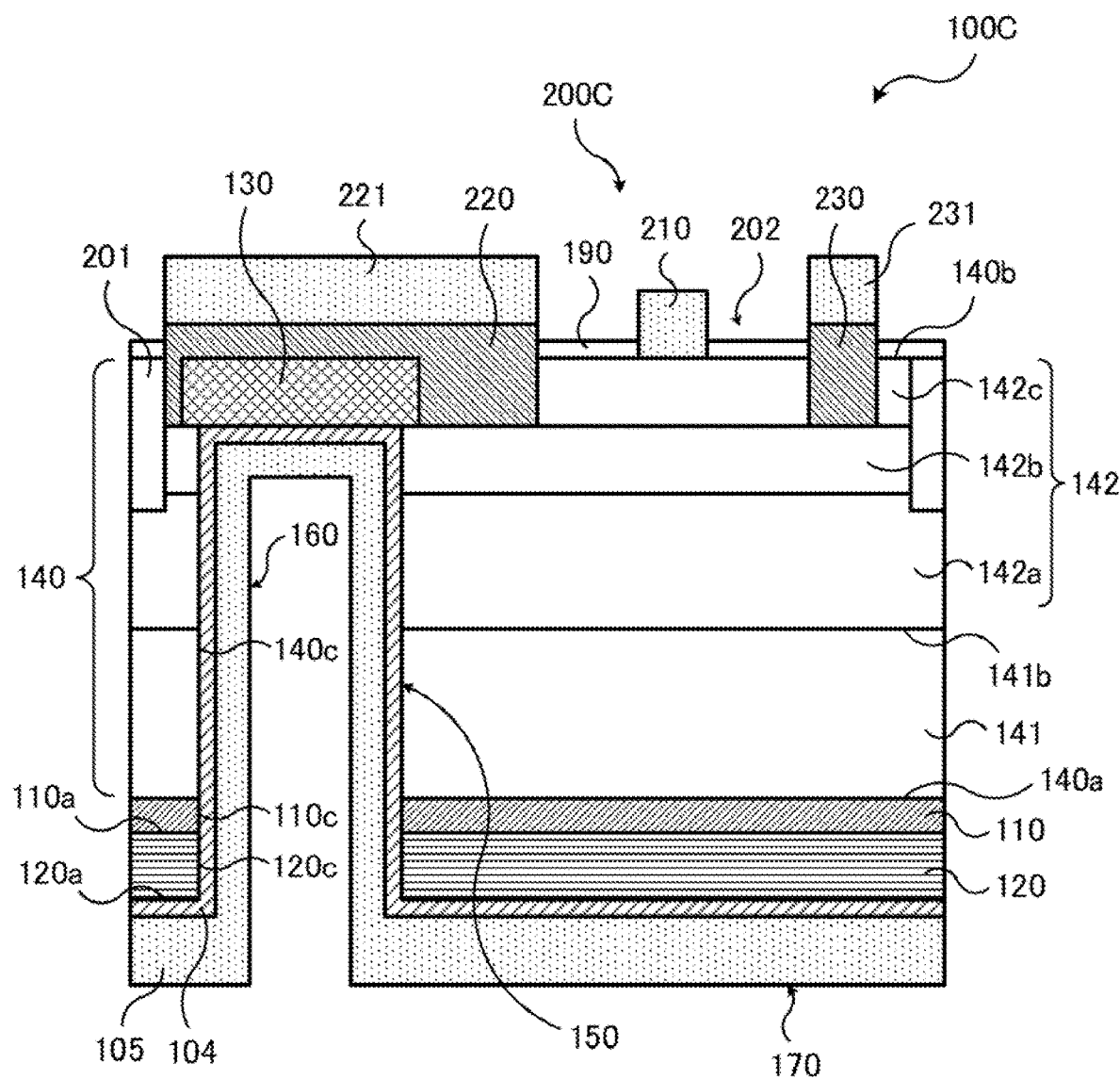
FIG. 14 is a sectional view illustrating an example of a semiconductor device according to a fourth embodiment.
Figure 15A:
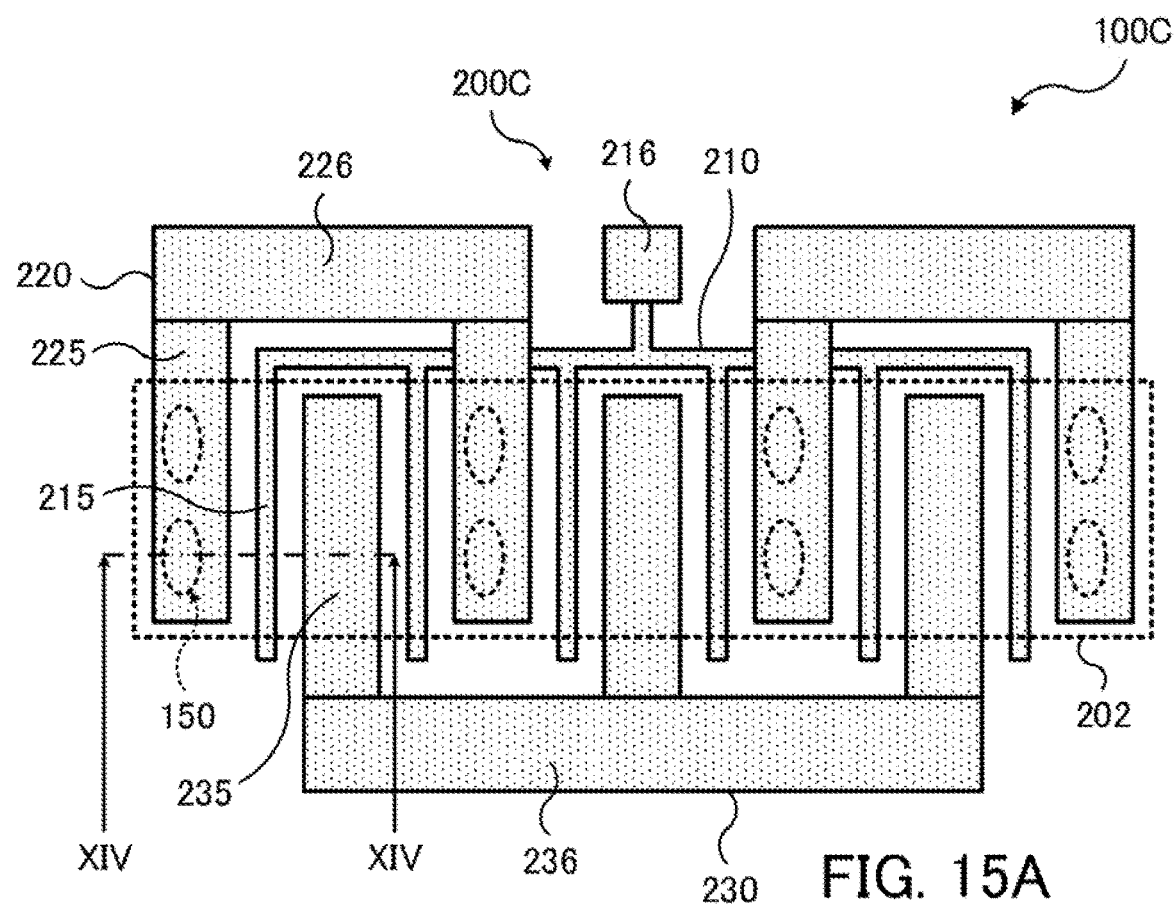
FIGS. 15A and 15B are first and second plan views, each of which illustrates the example of the semiconductor device according to the fourth embodiment.
Figure 15B:
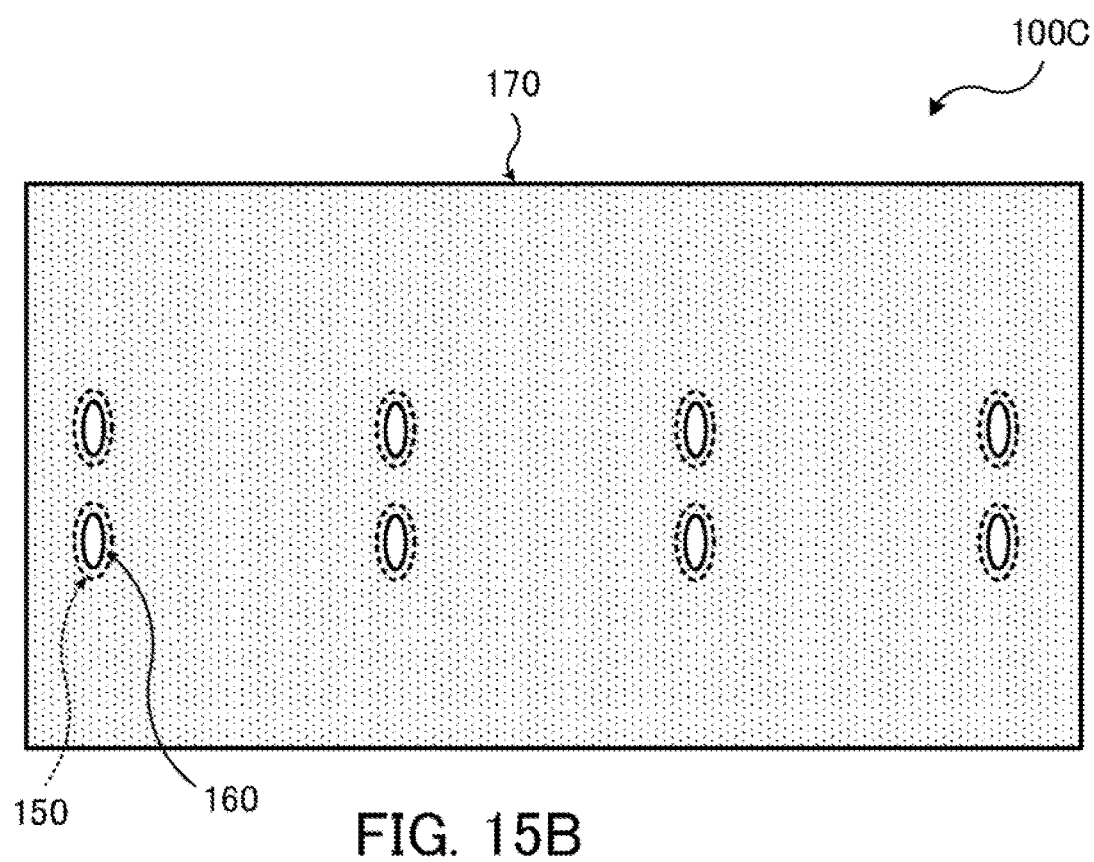

FIG. 14 and FIGS. 15A and 15B illustrate an example of a semiconductor device according to a fourth embodiment. More specifically, FIG. 14 is a schematic cross section of a main portion of an example of a semiconductor device according to a fourth embodiment. FIG. 15A is a schematic plan view of the main portion of the example of the semiconductor device according to the fourth embodiment, seen from a surface where a transistor is formed. FIG. 15B is a schematic plan view of the main portion of the example of the semiconductor device according to the fourth embodiment, seen from a surface opposite to the surface where the transistor is formed.

This semiconductor device 100C illustrated in FIG. 14 and FIGS. 15A and 15B includes a transistor 200C having a multi-finger electrode structure.

FIG. 15A is a schematic plan view illustrating a layout of a gate electrode 210, a source electrode 220, and a drain electrode 230 of the transistor 200C and a layout of via holes 150 of the semiconductor device 1000. FIG. 15B is a schematic plan view illustrating a layout of the via holes 150, via wirings 160, and a wiring 170 of the semiconductor device 100C. FIG. 14 is a schematic cross section taken along a line XIV-XIV in FIG. 15A.

As illustrated in FIG. 14, the semiconductor device 100C has an etching stopper layer 130 in an individual source electrode 220 (in an individual source finger portion 225 illustrated in FIG. 15A). The individual source electrode 220 is formed to pass through a cap layer 142c of a GaN-based epitaxial layer 142 of a semiconductor substrate 140 and to reach a barrier layer 142b. The etching stopper layers 130 are formed on the barrier layer 142b, and the source electrodes 220 (the source finger portions 225) are formed to cover their respective etching stopper layers 130. A source wiring 221 is formed on each of the source electrodes 220. The via holes 150 are formed to pass through a mask layer 120, a seed layer 110, and the semiconductor substrate 140 (a GaN substrate 141 and a channel layer 142a and the barrier layer 142b of the GaN-based epitaxial layer 142) and to reach their respective etching stopper layers 130. The individual via wirings 160 are formed on the inner surfaces of their respective via holes 150.

The same structure as that of the source electrode 220 in FIG. 14 is adopted for each of the plurality of source finger portions 225 as illustrated in FIG. 15A. The via holes 150 and the via wirings 160 may be formed at a plurality of locations of each source finger portion 225 (two locations for each source finger portion 225 in the example in FIGS. 15A and 15B), in order to increase the connection area with the wiring 170 set to a GND potential and to equally distribute the connection portions.

The semiconductor device 100C differs from the semiconductor device 100A according to the above second embodiment in the structure described above.

In the case of the semiconductor device 100C, an Au-containing layer is used as the seed layer 110, which is the base layer of the mask layer 120. In this way, when the semiconductor substrate 140 including the GaN substrate 141 and the GaN-based epitaxial layer 142 is etched by using the mask layer 120 containing Ni an a mask and by using Cl-based gas, occurrence of side etching on the seed layer 110 is prevented. Since occurrence of side etching on the seed layer 110 is prevented, disconnection of the via wirings 160 formed on the inner surfaces of the via holes 150 is prevented. The source finger portions 225 of the transistor 200C are connected to the wiring 170 set to the GND potential via the etching stopper layers 130 formed in the source finger portions 225 and via the via wirings 160 whose disconnection is prevented. That is, the source finger portions 225 are connected to GND. In this way, the high performance semiconductor device 100C including the transistor 200C having a low source inductance and excellent characteristics is obtained.

Fifth Embodiment

Figure 16:
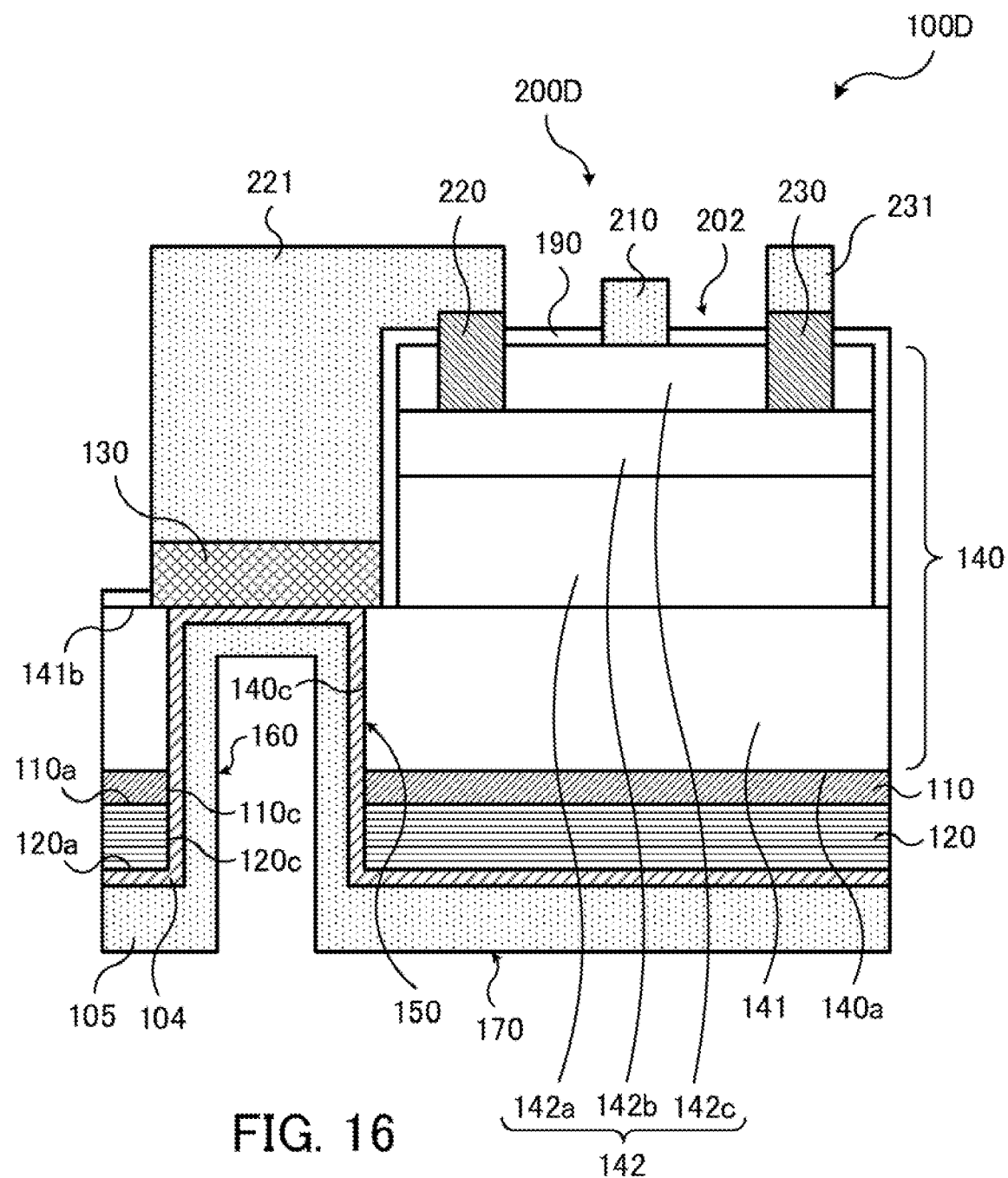
FIG. 16 is a sectional view illustrating an example of a semiconductor device according to a fifth embodiment.

FIG. 16 illustrates an example of a semiconductor device according to a fifth embodiment. More specifically, FIG. 16 is a schematic cross section of a main portion of an example of a semiconductor device according to a fifth embodiment.

In the case of this semiconductor device 100D illustrated in FIG. 16, a GaN-based epitaxial layer 142 is formed in the shape of a mesa on a GaN substrate 141 of a semiconductor substrate 140, and a transistor 200D is formed at the GaN-based epitaxial layer 142 formed in the shape of a mesa. The GaN-based epitaxial layer 142 formed in the shape of a mesa serves as an active region 202 in which the transistor 200D is formed.

In the case of the semiconductor device 100D, an etching stopper layer 130 is formed on a region on a surface 141b of the GaN substrate 141, the region being outside the GaN-based epitaxial layer 142 in the shape of a mesa. A source electrode 220 formed at the mesa-shaped GaN-based epitaxial layer 142 and the etching stopper layer 130 formed on the GaN substrate 141 outside the GaN-based epitaxial layer 142 are connected to each other via a source wiring 221. In addition, a via hole 150 is formed to pass through a mask layer 120, a seed layer 110, and the GaN substrate 141 from a surface 140a to the surface 141b and to reach the etching stopper layer 130. A via wiring 160 is formed on the inner surface of the via hole 150, and a wiring 170 continuing from the via wiring 160 is formed on a surface 120a of the mask layer 120.

The semiconductor device 100D differs from the semiconductor device 100A according to the second embodiment in the above structure.

In the case of the semiconductor device 100D, an Au-containing layer is used as the seed layer 110 serving as the base layer of the mask layer 120. In this way, when the GaN substrate 141 of the semiconductor substrate 140 is etched by using the mask layer 120 containing Ni as a mask and by using Cl-based gas, occurrence of side etching on the seed layer 110 is prevented. Since occurrence of side etching on the seed layer 110 is prevented, disconnection of the via wiring 160 formed on the inner surface of the via hole 150 is prevented. The source electrode 220 of the transistor 200D is connected to the wiring 170 set to a GND potential via the source wiring 221, the etching stopper layer 130, and the via wiring 160. That is, the source electrode 220 is connected to GND. In this way, the high performance semiconductor device 100D including the transistor 200D having a low source inductance and excellent characteristics is obtained.

Next, a manufacturing method of the semiconductor device 100D having the above structure will be described.

FIGS. 17A to 21B illustrate an example of a manufacturing method of the semiconductor device according to the fifth embodiment. FIGS. 17A to 21B are each a schematic cross section of a main portion of the semiconductor device according to the fifth embodiment in an example of a step of a manufacturing method of the semiconductor device.

Figure 17A:
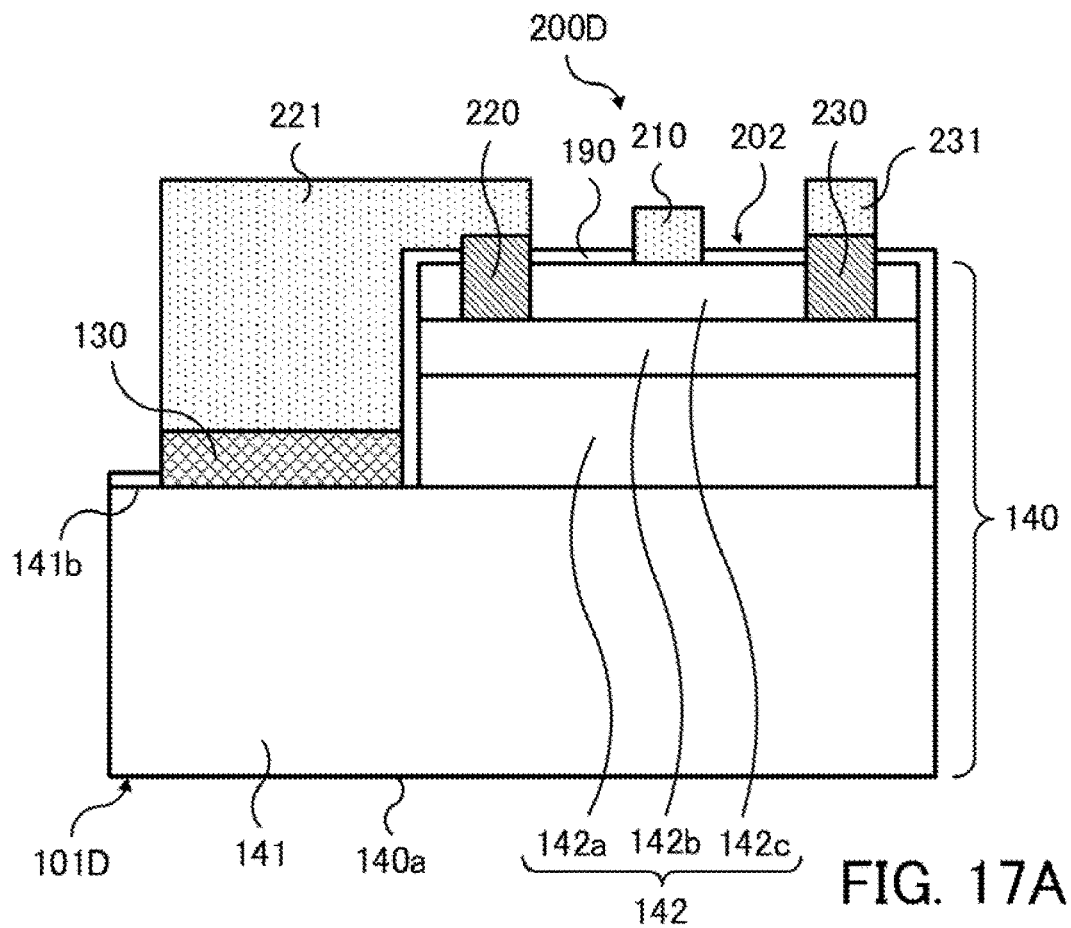
FIGS. 17A and 17B are first and second sectional views, each of which illustrates an example of a semiconductor device manufacturing method according to the fifth embodiment.

First, a structure 101D as illustrated in FIG. 17A is prepared. The structure 101D is an example of a basic structure of the semiconductor device 100D before the via hole 150, the via wiring 160, and the wiring 170 as described above are formed.

For example, the structure 101D has a structure in which a GaN channel layer 142a, an AlGaN barrier layer 142b, and a GaN cap layer 142c forming the GaN-based epitaxial layer 142 are sequentially formed on the surface 141b of the semi-insulating GaN substrate 141 having a thickness of 350 µm by using a MOVPE method, for example. A GaN layer doped with Fe may be inserted between the GaN substrate 141 and the channel layer 142a.

Regarding the growing of the individual layers by using the MOVPE method, a mixed gas of TMGa and $NH_3$ is used to grow GaN. In addition, a mixed gas of TMAl, TMGa, and $NH_3$ is used to grow AlGaN. Depending on the nitride semiconductor to grow, the supply and stoppage (switching) of TMGa and TMAl and the flow amounts used when these materials are supplied (mixing ratio with respect to the other materials) are suitably set. In addition, depending on the nitride semiconductor to grow, the growth pressure and the growth temperature are suitably set.

When the structure 101D is formed, first, a resist pattern is formed on a portion of the GaN-based epitaxial layer 142 grown on the GaN substrate 141, the portion left as the mesa-shaped active region 202. Next, by using a technique, such as dry etching or photo electrochemical (PEC) etching, the GaN-based epitaxial layer 142 is etched down to the surface 141b of the GaN substrate 141, for example. After this etching, the resist is removed. In this way, the semiconductor substrate 140 including the GaN substrate 141 and the mesa-shaped GaN-based epitaxial layer 142 formed on a portion of the surface 141b is formed. In this example manufacturing method, since the element isolation is achieved by etching the GaN-based epitaxial layer 142 in the shape of a mesa, an element isolation step of injecting Ar ions or the like is omitted. When the GaN-based epitaxial layer 142 is etched, the channel layer 142a may be left on the surface 141b of the GaN substrate 141, as long as 2DEG is not generated.

After the GaN-based epitaxial layer 142 is etched, recesses that pass through the cap layer 142c and reach the barrier layer 142b are formed, and the source electrode 220 and a drain electrode 230 are formed by using a photolithography technique, a deposition technique, and a liftoff technique. In addition, a gate electrode 210 is formed also by using a photolithography technique, a deposition technique, and a liftoff technique. A passivation film 190 containing SiN is formed on the semiconductor substrate 140 (on the mesa-shaped GaN-based epitaxial layer 142 and the GaN substrate 141) by using a plasma CVD method or the like.

Next, a resist pattern for processing a region where the etching stopper layer 130 is to be formed is formed, and dry-etching is performed on the passivation film 190 by using a mixed gas of $SF_6$ and $CHF_3$. After the resist is removed, to electroplate Ni that is to serve as the etching stopper layer 130, a multi-layer structure of Ti and Au is formed as a seed layer by using a sputtering method, for example. Next, on top of the seed layer, a resist pattern having an opening portion at the region where the etching stopper layer 130 is to be formed is formed. By using the seed layer as a feed layer, an Ni-electroplated layer is formed. Next, the resist is removed, and the seed layer exposed thereafter is removed by ion milling, for example.

As a result, the etching stopper layer 130 having a multi-layer structure of the seed layer, which is a multi-layer structure of Ti and Au, and the Ni-electroplated layer is formed. In this example, for convenience, the etching stopper layer 130 is schematically illustrated as a single layer.

Next, for example, a multi-layer structure of Ti, Pt, and Au is formed as a seed layer by using a sputtering method, and a resist pattern having opening portions at the regions where the source wiring 221 and the drain wiring 231 are to be formed is formed on the multi-layer structure. By using the seed layer as a feed layer, an Au-electroplated layer is formed. After the resist is removed, the seed layer exposed thereafter is removed by ion milling, for example. As a result, the source wiring 221 and the drain wiring 231 having a multi-layer structure of the seed layer, which is a Ti—Pt—Au multi-layer structure, and the Au-electroplated layer are formed. The source wiring 221 is formed to connect to the etching stopper layer 130. In this example, for convenience, the source wiring 221 and the drain wiring 231 are each schematically illustrated as a single layer.

Through these steps as described above, the structure 101D as illustrated in FIG. 17A is obtained. The structure 101D is a basic structure of the semiconductor device 100D and includes the transistor 200D.

Figure 17B:
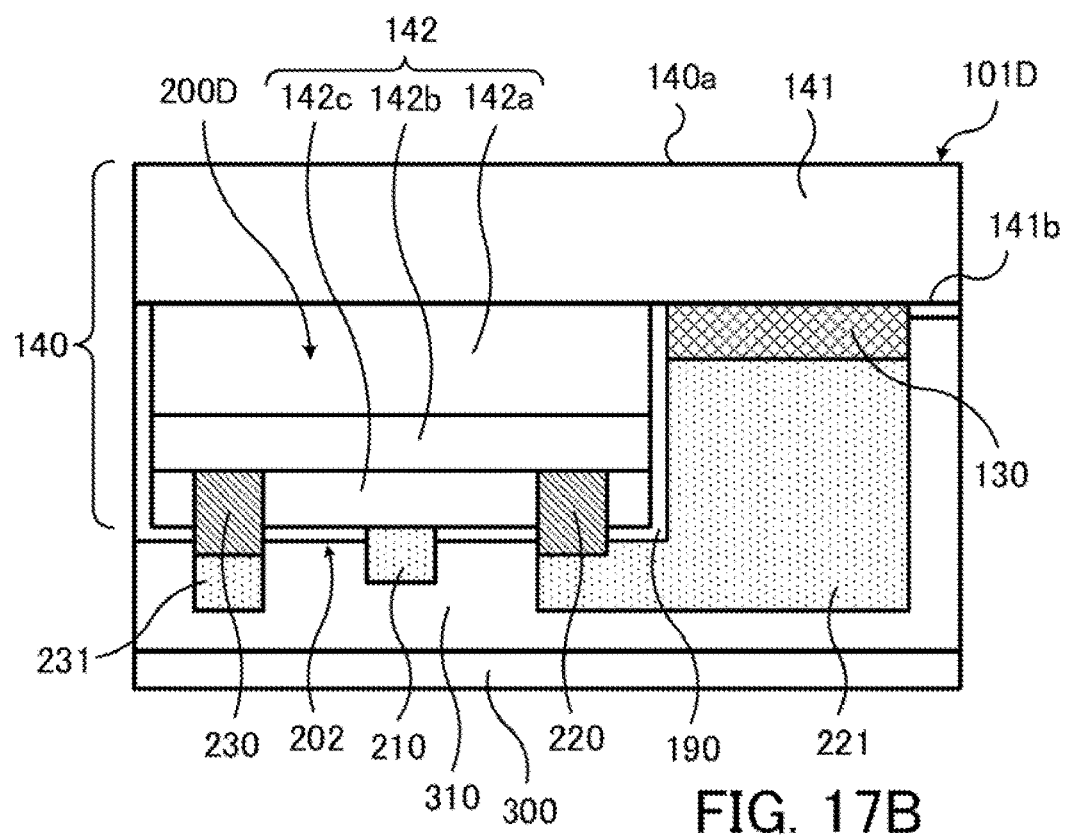

In the case of the obtained structure 101D, thermoplastic adhesive 310 is applied to the surface on which the transistor 200D is formed, as illustrated in FIG. 17B. Next, a support plate 300 is bonded to the thermoplastic adhesive 310. Next, a surface of the GaN substrate 141, the surface being opposite to the surface on which the transistor 200D is formed, is ground and polished. In this way, the GaN substrate 141 is thinned to a thickness of approximately 100 µm.

Figure 18A:
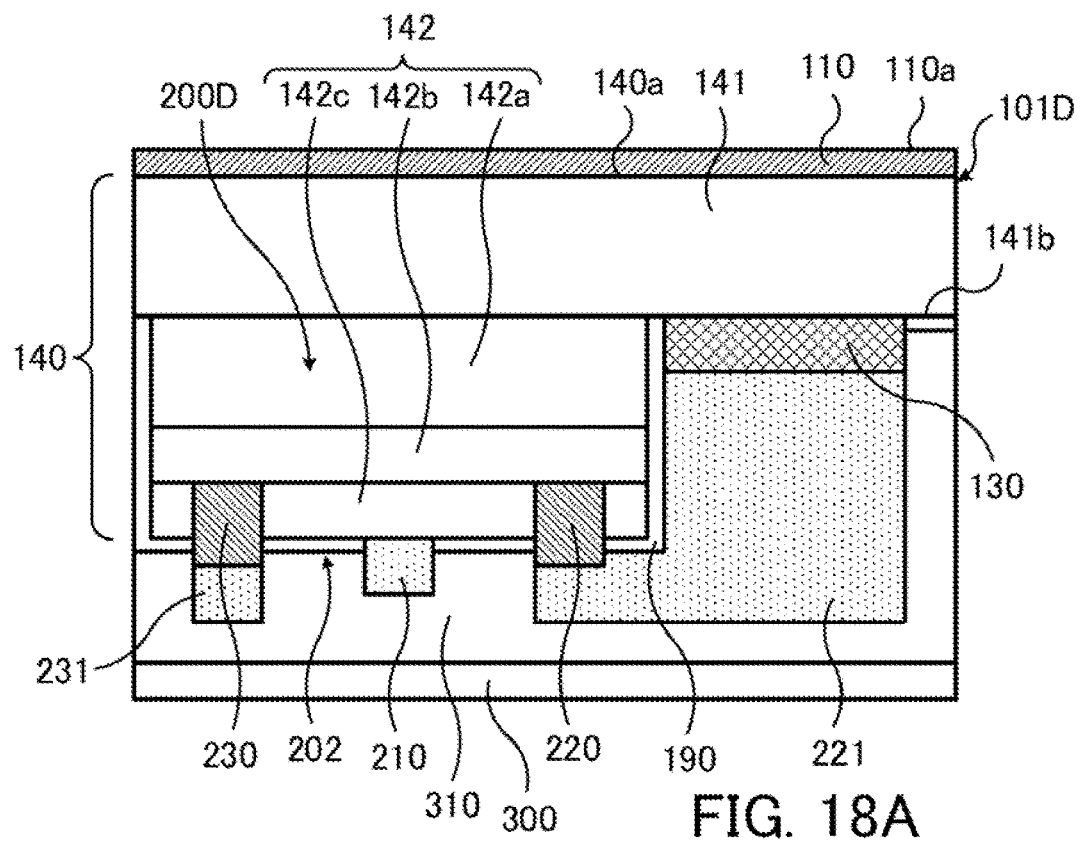
FIGS. 18A and 18B are third and fourth sectional views, each of which illustrates the example of the semiconductor device manufacturing method according to the fifth embodiment.
Figure 18B:
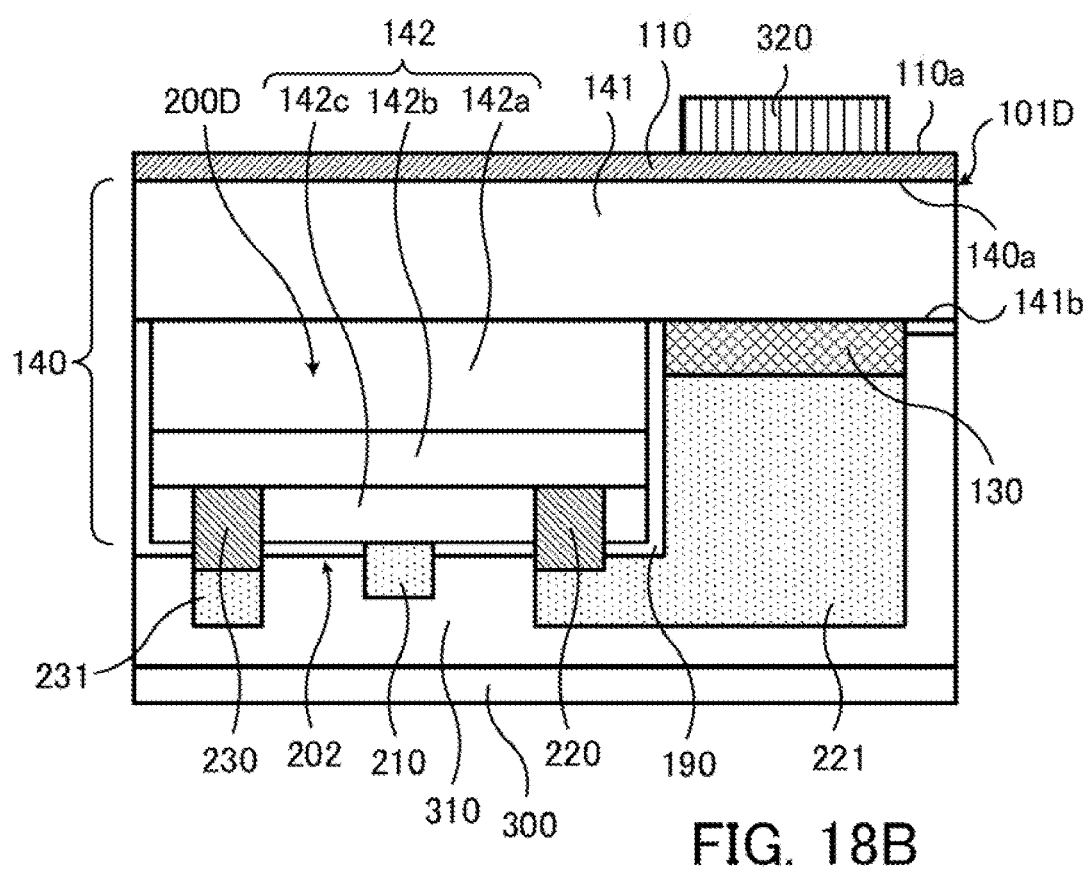

Next, as illustrated in FIG. 18A, the seed layer 110, which is a multi-layer structure of Ti and Au, is formed on the surface of the thinned GaN substrate 141, that is, on the surface 140a of the semiconductor substrate 140, by using a sputtering method, for example. In this example, the seed layer 110 contains Au as its main component. For example, the seed layer 110 having a multi-layer structure of a Ti layer having a thickness of approximately 10 nm to 30 nm and an Au layer having a thickness of approximately 200 nm to 400 nm is formed. After the seed layer 110 is formed, as illustrated in FIG. 18B, resist 320 is formed on the surface 110a of the formed seed layer 110 such that the resist 320 covers the portion corresponding to the region where the via hole 150 is to be formed. The diameter of the formed resist 320 (corresponding to the diameter of the via hole 150 to be formed) is, for example, 80 µm.

Figure 19A:
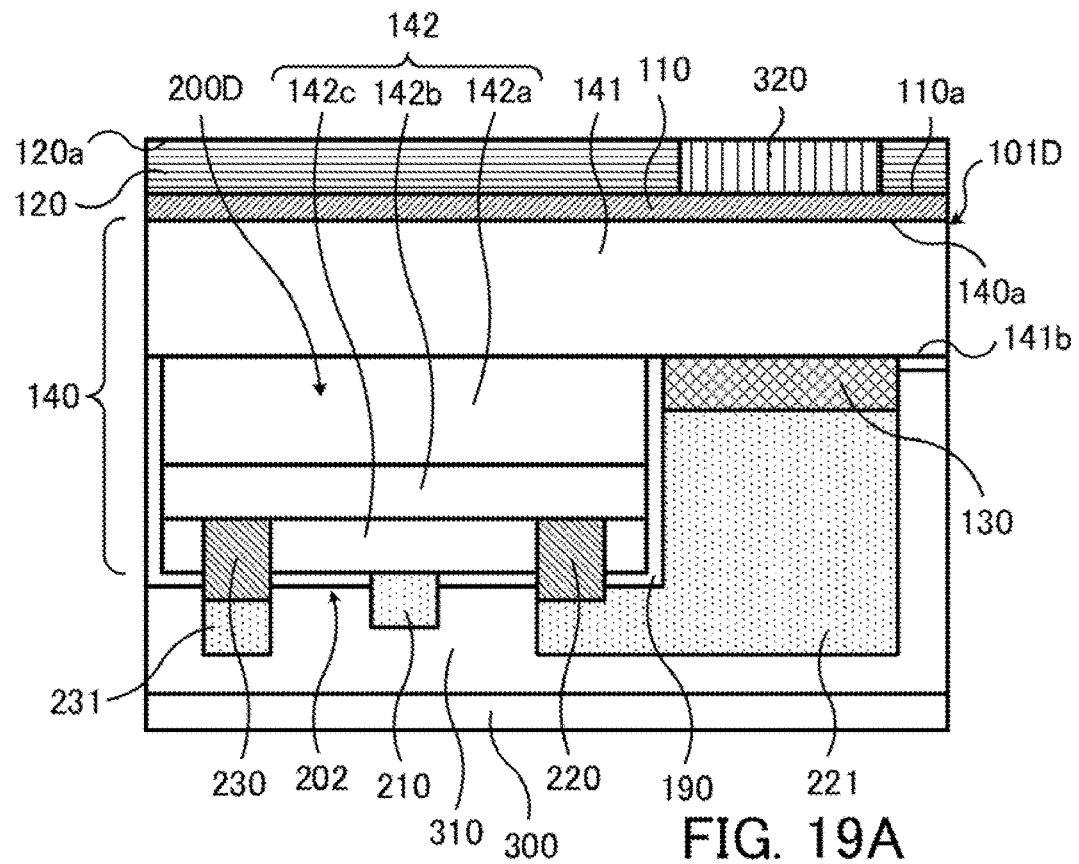
FIGS. 19A and 19B are fifth and sixth sectional views, each of which illustrates the example of the semiconductor device manufacturing method according to the fifth embodiment.
Figure 19B:
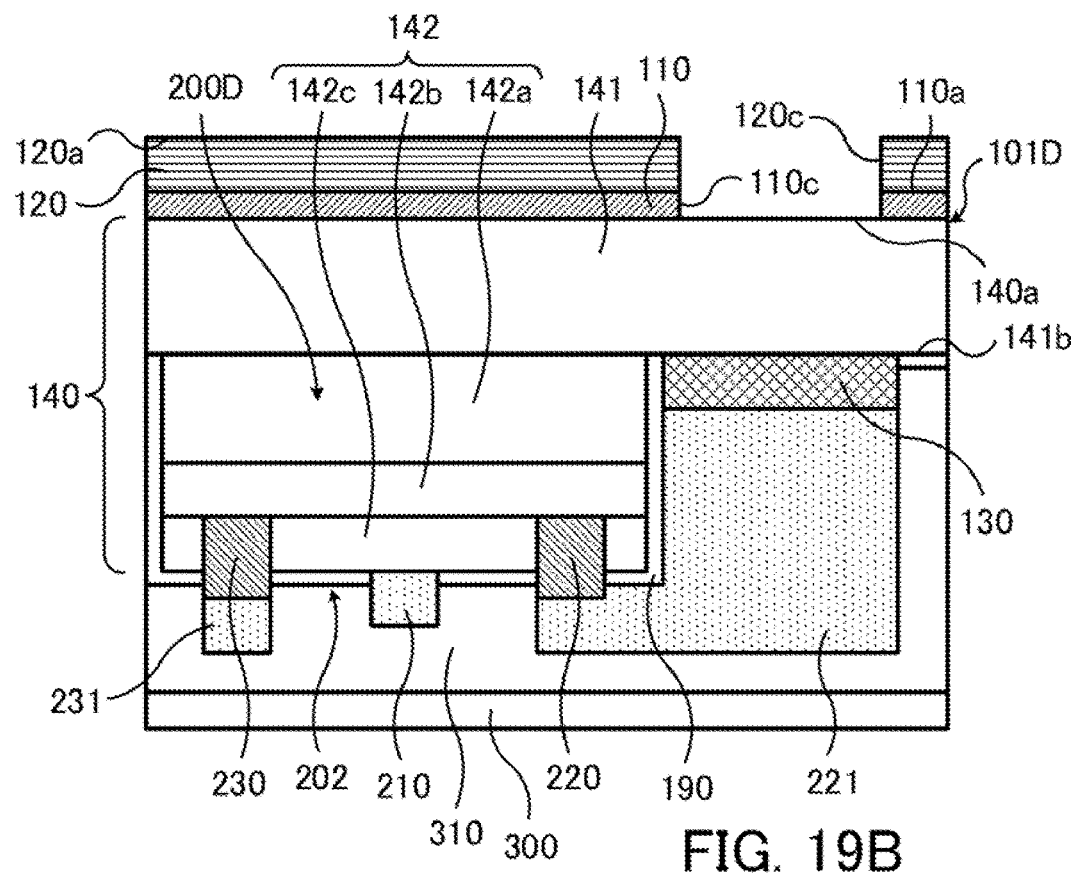

After the resist 320 is formed, as illustrated in FIG. 19A, an Ni-electroplated layer, which is to serve as the mask layer 120, is formed by using the seed layer 110 as a feed layer. Next, as illustrated in FIG. 19B, the resist is removed, and the seed layer 110 exposed thereafter is removed by ion milling, for example. In this way, a structure in which the seed layer 110 having an opening portion 110c and containing Au as its main component is formed as the base layer and the Ni-electroplated layer having an opening portion 120c is formed as the mask layer 120 on the seed layer 110, the opening portion 120c being connected to the opening portion 110c, is obtained.

Figure 20A:
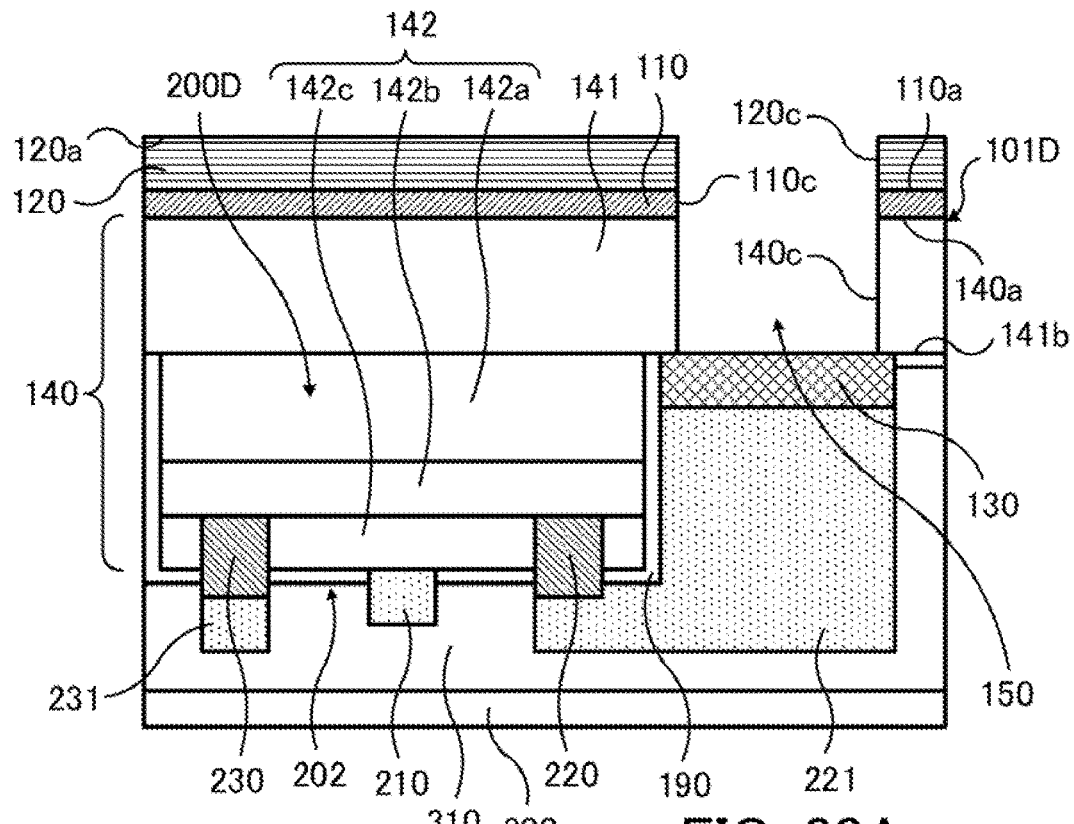
FIGS. 20A and 20B are seventh and eighth sectional views, each of which illustrates the example of the semiconductor device manufacturing method according to the fifth embodiment.

Next, as illustrated in FIG. 20A, the GaN substrate 141 is etched from the direction of the mask layer 120 by using the mask layer 120 as a mask. ICP etching is performed as this etching by using a mixed gas of $Cl_2$ and $BCl_1$, whose gas ratio is 10%. This etching is performed under the conditions that the pressure is 2 Pa, the upper electrode power is 2 kW, and the lower electrode power is 0.25 kW. The etching rate of GaN is, for example, 1.5 µm/min. The GaN substrate 141 is etched by using the mask layer 120 as a mask under the above conditions. As a result, an opening portion 140c of the semiconductor substrate 140 (the GaN substrate 141), the opening portion 140c being connected to the opening portion 120c of the mask layer 120 and the opening portion 110c of the seed layer 110, is formed. Consequently, the via hole 150 that passes through the mask layer 120, the seed layer 110, and the GaN substrate 141 from the surface 140a to the surface 141b and that reaches the etching stopper layer 130 is formed. After the via hole 150 is formed, to prevent erosion by the remaining Cl, the semiconductor device 100D is washed with running pure water.

As described above, Cl-based gas is used for the etching of the GaN substrate 141. When the etching using Cl-based gas is performed, if a layer containing Cu as its main component is used as the seed layer 110, side etching occurs. In contrast, in this example manufacturing method, a layer containing Au as its main component, the layer having a relatively high etching resistance with respect to Cl-based gas, is formed as the seed layer 110. In this way, even when the GaN substrate 141 is etched by using Cl-based gas to form the via hole 150, occurrence of side etching on the seed layer 110 is prevented.

Figure 20B:
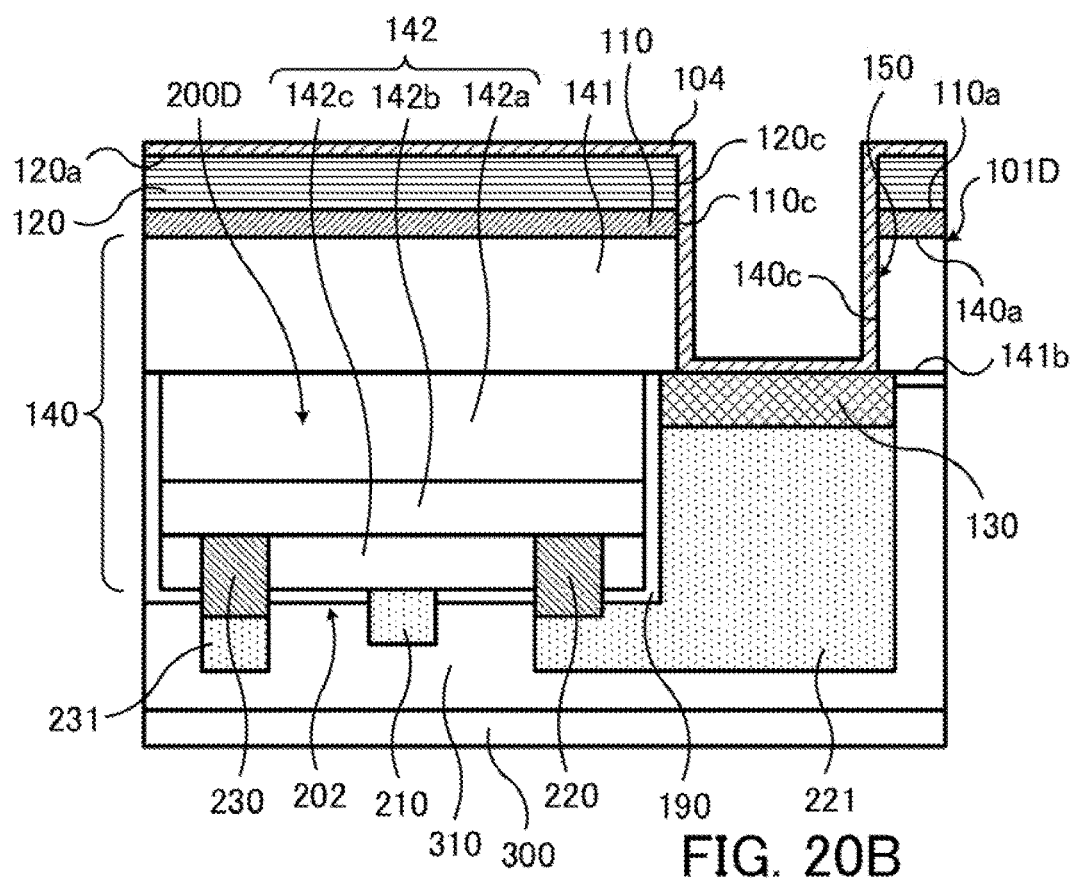
Figure 21A:
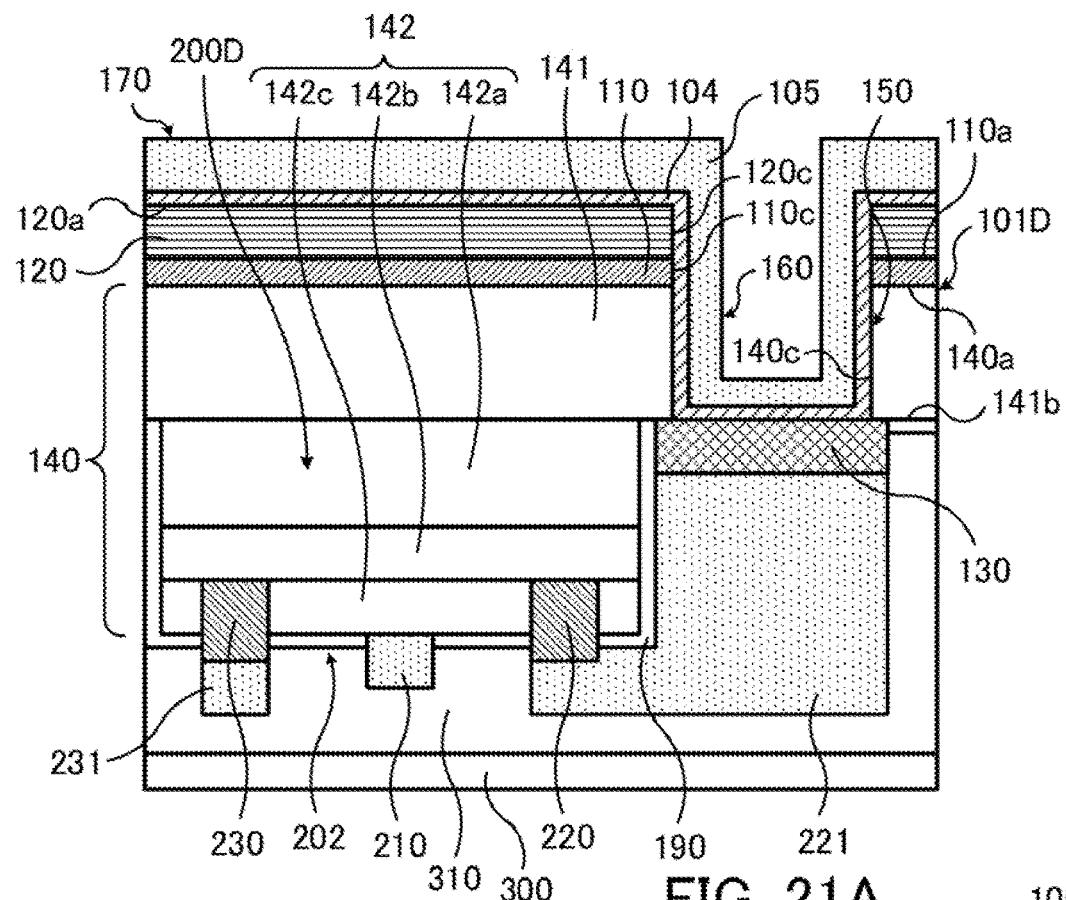
FIGS. 21A and 21B are ninth and tenth sectional views, each of which illustrates the example of the semiconductor device manufacturing method according to the fifth embodiment.

After the via hole 150 is formed, as illustrated in FIG. 20B, a seed layer 104 is formed on the inner surface of the formed via hole 150, that is, on the inner surface of the opening portion 120c of the mask layer 120, the inner surface of the opening portion 110c of the seed layer 110, and the inner surface of the opening portion 140c of the GaN substrate 141. For example, the seed layer 104 having a multi-layer structure of Ti and Au is formed by using a sputtering method, after reverse sputtering. Next, after the seed layer 104 is formed, as illustrated in FIG. 21A, by using the seed layer 104 as a feed layer, an Au-electroplated layer is formed to form a conductor layer 105. In this way, the via wiring 160 is formed on the inner surface of the via hole 150, and the wiring 170 continuing from the via wiring 160 on the inner surface of the via hole 150 is formed on the surface 120a of the mask layer 120.

As described above, in this example manufacturing method, since a layer containing Au as its main component is formed as the seed layer 110, even when etching using Cl-based gas is performed, occurrence of side etching on the seed layer 110 is prevented. Thus, when the seed layer 104 is formed as illustrated in FIG. 20B, the seed layer 104 continuously covers a portion at the seed layer 110 in the via hole 150 along with the other portions. That is, the seed layer 104 is suitably formed at the portion at the seed layer 110. Since the seed layer 104 is suitably formed at the portion at the seed layer 110, when the conductor layer 105 as illustrated in FIG. 21A is formed by using an electroplating method, the conductor layer 105 is formed on the seed layer 104 covering the portion at the seed layer 110 in the via hole 150 continuously with the other portions. In this way, the via wiring 160 whose disconnection due to occurrence of side etching on the seed layer 110 in the via hole 150 is prevented is formed on the inner surface of the via hole 150.

Figure 21B:
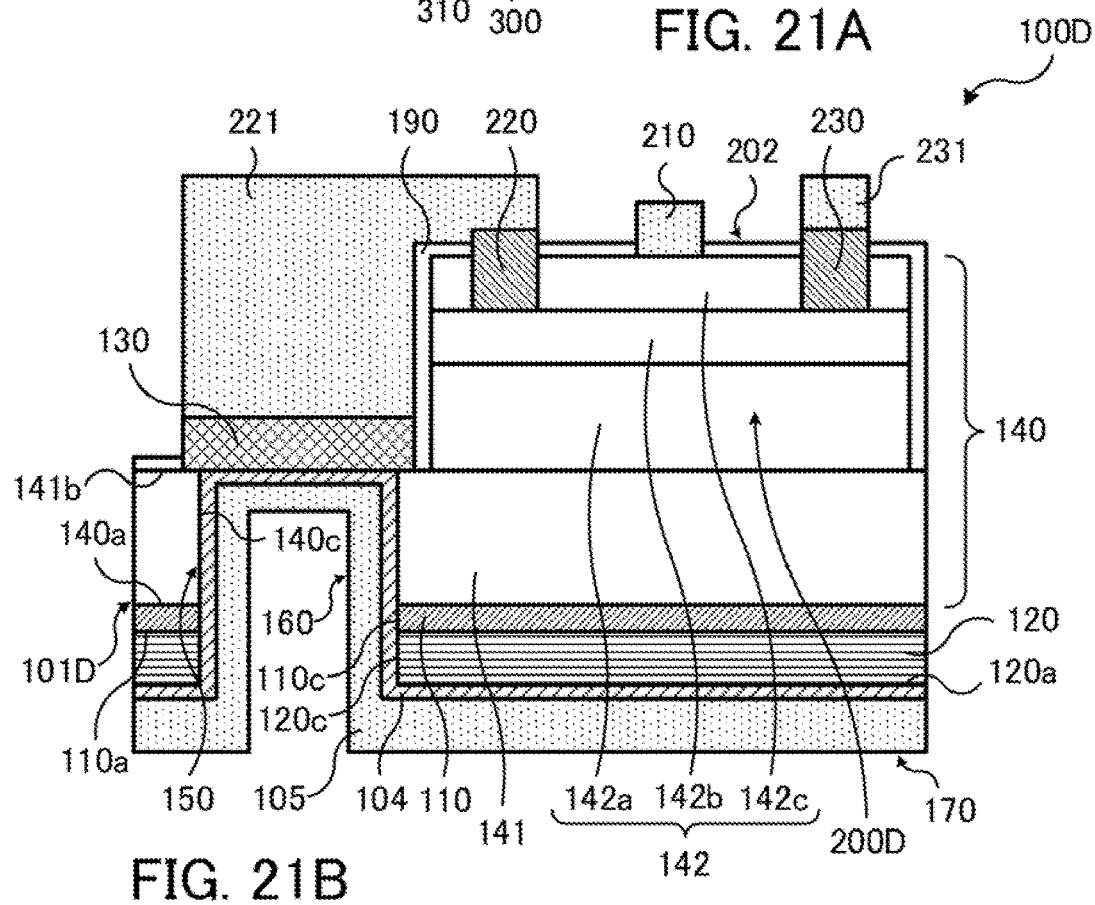

After the via wiring 160 and the wiring 170 are formed, the support plate 300 is peeled off, and the thermoplastic adhesive 310 is removed. In this way, the semiconductor device 100D including the through hole wiring as illustrated in FIG. 21B is obtained.

With the semiconductor device 100D obtained in accordance with this example manufacturing method, when the GaN substrate 141 is etched by using Cl-based gas, occurrence of side etching on the seed layer 110 in the via hole 150 is prevented, and disconnection of the via wiring 160 formed after the etching is prevented. In this way, the source electrode 220 of the transistor 200D is connected to the wiring 170 set to the GND potential via the source wiring 221, the etching stopper layer 130, and the via wiring 160. That is, the source electrode 220 is connected to GND. Thus, the high performance semiconductor device 100D including the transistor 200D having a low source inductance and excellent characteristics is obtained.

The multi-layer structure of the GaN-based epitaxial layer 142 for forming any one of the transistors 200A to 200D (HEMTs) of the semiconductor devices 100A to 100D according to the second to fifth embodiments is not limited to the above example. For example, the GaN-based epitaxial layer 142 may be formed without the cap layer 142c. Alternatively, another cap layer may be formed on the cap layer 142c. Still alternatively, a spacer layer may be formed between the channel layer 142a and the barrier layer 142b. Still alternatively, another barrier layer or a buffer layer may be formed under the channel layer 142a. Various kinds of GaN-based nitride semiconductor suitable for the individual functions may be used for the individual layers forming the GaN-based epitaxial layer 142.

In addition, each of the transistors 200A to 200D (HEMTs) may be configured as a MIS transistor by forming the gate electrode 210 via a gate insulating film such as oxide, nitride, or oxynitride on the GaN-based epitaxial layer 142.

Sixth Embodiment

Figure 22:
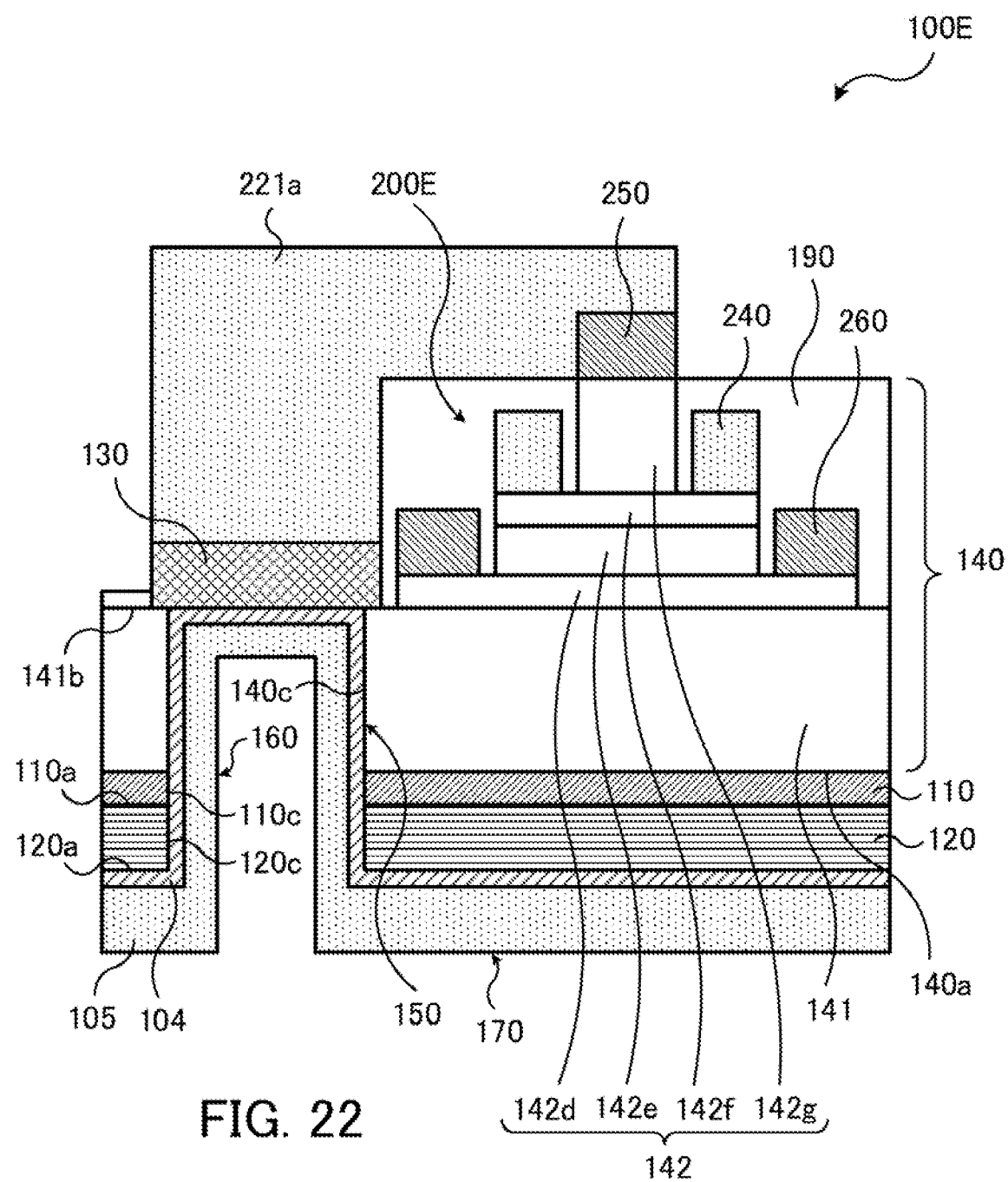
FIG. 22 is a sectional view of an example of a semiconductor device according to a sixth embodiment.

FIG. 22 illustrates an example of a semiconductor device according to a sixth embodiment. More specifically, FIG. 22 is a schematic cross section of a main portion of an example of a semiconductor device according to a sixth embodiment.

This semiconductor device 100E illustrated in FIG. 22 includes an HBT as a transistor 200E formed on a GaN-based epitaxial layer 142. In this respect, the semiconductor device 100E differs from that semiconductor device 100D according to the above fifth embodiment.

The semiconductor device 100E includes a GaN substrate 141 and the GaN-based epitaxial layer 142 grown on the GaN substrate 141. An HBT is formed as the transistor 200E on the GaN-based epitaxial layer 142.

The GaN-based epitaxial layer 142 of the semiconductor device 100E includes a sub-collector layer 142d, a collector layer 142e, a base layer 142f, and an emitter layer 142g. The sub-collector layer 142d is formed on the GaN substrate 141. For example, n+ type GaN relatively heavily doped with an n type impurity is used for the sub-collector layer 142d. The collector layer 142e is formed on a portion of the sub-collector layer 142d. For example, GaN is used for the collector layer 142e. The base layer 142f is formed on the collector layer 142e. For example, p type GaN doped with a p type impurity is used for the base layer 142f. The emitter layer 142g is formed on a portion of the base layer 142f. For example, AlGaN is used for the emitter layer 142g. A base electrode 240 is connected to a portion of the base layer 142f, the portion where the emitter layer 142g is not formed. The emitter layer 142g is connected to an emitter electrode 250. A collector electrode 260 is connected to a portion of the sub-collector layer 142d, the portion where the collector layer 142e is not formed.

The transistor 200E formed on the GaN-based epitaxial layer 142 is covered by a passivation film 190. The emitter electrode 250 exposed from the passivation film 190 is connected to an etching stopper layer 130 formed on a surface 141b of the GaN substrate 141 via an emitter wiring 221a.

In addition, a via hole 150 is formed to pass through a mask layer 120, which is formed in the direction of a surface 140a of the GaN substrate 141, a seed layer 110, which is a base layer of the mask layer 120, and the GaN substrate 141 and to reach the etching stopper layer 130. The surface 140a is opposite to the surface at which the transistor 200E is formed. A via wiring 160 connected to the etching stopper layer 130 is formed on the inner surface of the via hole 150, and a wiring 170 that continues from the via wiring 160 is formed on a surface 120a of the mask layer 120. Since an Au-containing layer is used as the seed layer 110, when the via hole 150 is formed by using Cl-based gas, occurrence of side etching on the seed layer 110 is prevented, and disconnection of the via wiring 160 formed on the inner surface of the via hole 150 is prevented.

The emitter electrode 250 of the transistor 200E formed at the GaN-based epitaxial layer 142 is connected to the wiring 170 set to a GND potential via the emitter wiring 221a, the etching stopper layer 130, and the via wiring 160. That is, the emitter electrode 250 is connected to GND. Since the GND connection is made by the through hole wiring, the high performance semiconductor device 100E including the transistor 200E having a low emitter inductance and excellent characteristics is obtained.

As is the case with this semiconductor device 100E, other than an HEMT, an HBT as the transistor 200E may be formed at the GaN-based epitaxial layer 142 on the GaN substrate 141 of the semiconductor substrate 140.

Seventh Embodiment

Figure 23:
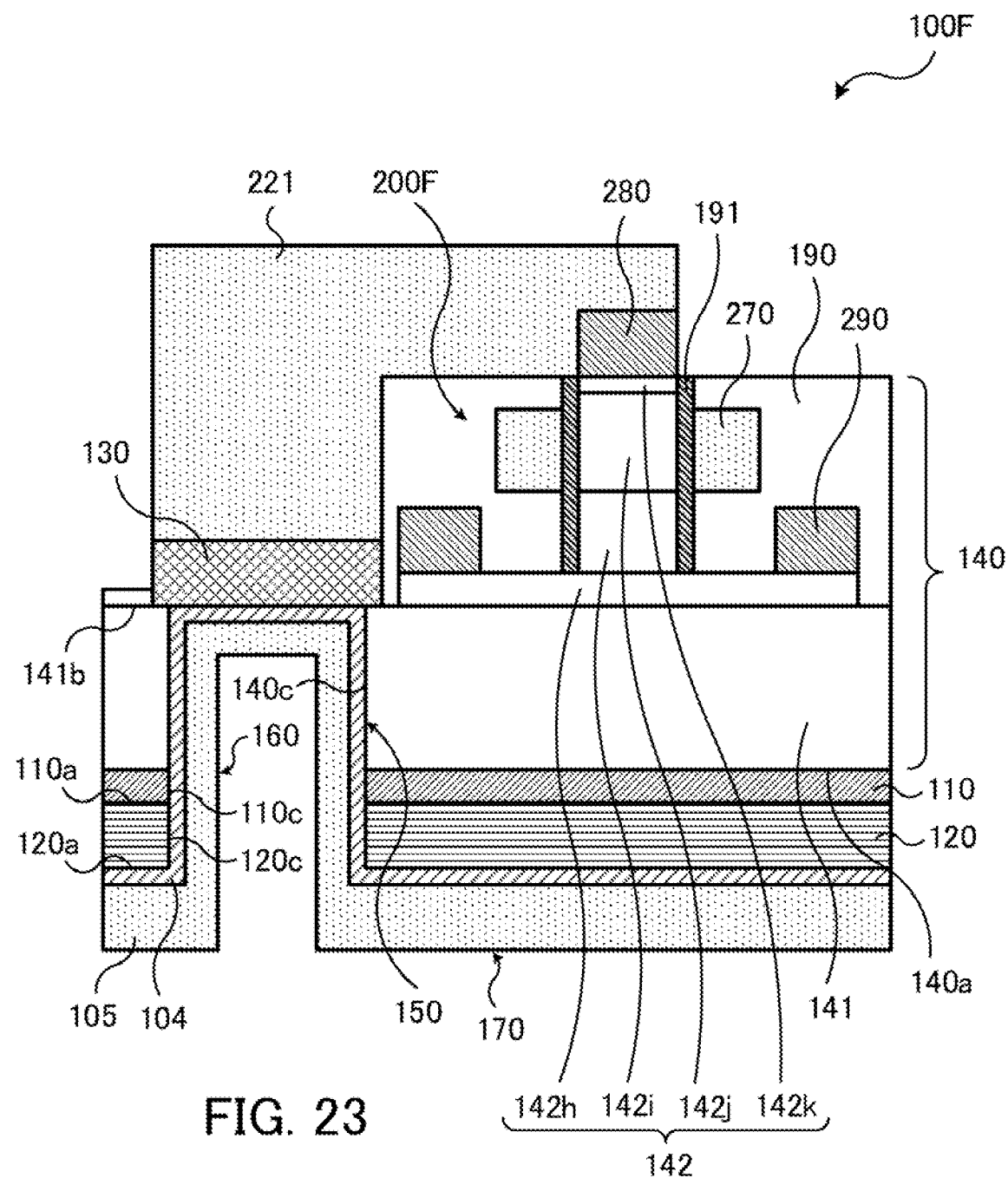
FIG. 23 is a sectional view of an example of a semiconductor device according to a seventh embodiment.

FIG. 23 illustrates an example of a semiconductor device according to a seventh embodiment. More specifically, FIG. 23 is a schematic cross section of a main portion of an example of a semiconductor device according to a seventh embodiment.

In the case of this semiconductor device 100F illustrated in FIG. 23, a fin FET or a nanowire FET is formed as a transistor 200F formed at a GaN-based epitaxial layer 142. In this respect, the semiconductor device 100F differs from the semiconductor device 100D according to the above fifth embodiment.

The semiconductor device 100F includes a GaN substrate 141 and the GaN-based epitaxial layer 142 grown thereon. A fin FET or a nanowire FET is formed as the transistor 200F at the GaN-based epitaxial layer 142.

The GaN-based epitaxial layer 142 of the semiconductor device 100F includes a contact layer 142h, a drift layer 142i, a channel layer 142j, and a contact layer 142k. The contact layer 142h is formed on the GaN substrate 141. For example, n+ type GaN is used for the contact layer 142h. The drift layer 142i is formed on a portion of the contact layer 142h. For example, GaN is used for the drift layer 142i. The channel layer 142j is formed on the drift layer 142i. For example, n type GaN doped with n type impurity is used for the channel layer 142j. The contact layer 142k is formed on the channel layer 142j. For example, n+ type GaN is used for the contact layer 142k. The drift layer 142i, the channel layer 142j, and the contact layer 142k are formed in a fin shape or a nanowire shape. Gate insulating films 191 of AlO (aluminum oxide) or the like are formed on side surfaces of the drift layer 142i, the channel layer 142j, and the contact layer 142k having a fin shape or a nanowire shape. Gate electrodes 270 are formed on portions corresponding to the channel layer 142j via the gate insulating films 191. The contact layer 142k is connected to a source electrode 280. An individual drain electrode 290 is connected to a portion of the contact layer 142h, the portion where the drift layer 142i is not formed.

The transistor 200F formed at the GaN-based epitaxial layer 142 is covered by a passivation film 190. The source electrode 280 exposed from the passivation film 190 is connected to an etching stopper layer 130 formed on a surface 141b of the GaN substrate 141 via a source wiring 221.

A via hole 150 is formed to pass through a mask layer 120, which is formed in the direction of a surface 140a of the GaN substrate 141, a seed layer 110, which is a base layer of the mask layer 120, and the GaN substrate 141 and to reach the etching stopper layer 130. The surface 140a is opposite to the surface at which the transistor 200F is formed. A via wiring 160 connected to the etching stopper layer 130 is formed on the inner surface of the via hole 150, and a wiring 170 that continues from the via wiring 160 is formed on a surface 120a of the mask layer 120. Since an Au-containing layer is used as the seed layer 110, when the via hole 150 is etched by using Cl-based gas, occurrence of side etching on the seed layer 110 is prevented, and disconnection of the via wiring 160 formed on the inner surface of the via hole 150 is prevented.

The source electrode 280 of the transistor 200F formed at the GaN-based epitaxial layer 142 is connected to the wiring 170 set to a GND potential via the source wiring 221, the etching stopper layer 130, and the via wiring 160. That is, the source electrode 280 is connected to GND. Since the GND connection is made by the through hole wiring, the high performance semiconductor device 100F including the transistor 200F having a low source inductance and excellent characteristics is obtained.

As is the case with this semiconductor device 100F, other than an HEMT, a fin FET or a nanowire FET as the transistor 200F may be formed at the GaN-based epitaxial layer 142 on the GaN substrate 141 of a semiconductor substrate 140.

The above description has been made on the first to seventh embodiments.

In the above second to seventh embodiments, as an example, the GaN substrate 141 is used as a base substrate of the GaN-based epitaxial layer 142 of the semiconductor substrate 140. Other than the GaN substrate 141, any one of various kinds of nitride semiconductor substrates may be used as the base substrate of the GaN-based epitaxial layer 142, as long as etching using Cl-based gas is performed in the same way as that performed with the GaN substrate 141. For example, any one of various kinds of nitride semiconductor substrates expressed by a general formula $In_xAl_yGa_{1-(x+y)}N$ ($0 \leq x \leq 1$, $0 \leq y \leq 1$, $0 \leq x+y \leq 1$) may be used as the base substrate of the GaN-based epitaxial layer 142.

Similarly, any one of various kinds of nitride semiconductor layers expressed by a general formula $In_xAl_1Ga_{1-(x+y)}N$ ($0 \leq x \leq 1$, $0 \leq y \leq 1$, $0 \leq x+y \leq 1$) may be used as the GaN-based epitaxial layer 142, as long as etching using Cl-based gas is performed.

Alternatively, a SiC substrate or a Si substrate may be used as the base substrate of the GaN-based epitaxial layer 142. In this case, while the SiC substrate or Si substrate is etched by using F-based gas, the GaN-based epitaxial layer 142 formed thereon is etched by using Cl-based gas. Thus, by using an Au-containing layer as the seed layer 110 exposed to Cl-based gas, side etching on the seed layer 110 is prevented, and disconnection of the via wiring 160 to be formed is prevented.

In addition, in the above second to seventh embodiments, as an example, a multi-layer structure of Ti and Au is used as the seed layer 110. An Au layer or a layer containing Au as its main component may be used as the seed layer 110. When a layer containing Au as its main component is used as the seed layer 110, the component other than Au is not limited to Ti. The seed layer 110 may contain one or more kinds selected from tin (Sn), germanium (Ge), zinc (Zn), Pt, etc. The upper limit of the contained amount of a component other than Au is set, for example, up to approximately 40 at %, preferably 20 at %, and more preferably approximately 10 at %. Au of the seed layer 110 and a component other than Au may form a multi-layer structure, an alloy, or an intermetallic compound.

For example, the semiconductor devices 1A, 1B, 100A, 100B, 100C, 100D, 100E, and 100F having their respective configurations according to the above first to seventh embodiments may be applied to various kinds of electronic devices.

Eighth Embodiment

An application example in which a semiconductor device having any one of the above configurations is applied to an amplifier will be described as an eighth embodiment.

Figure 24:
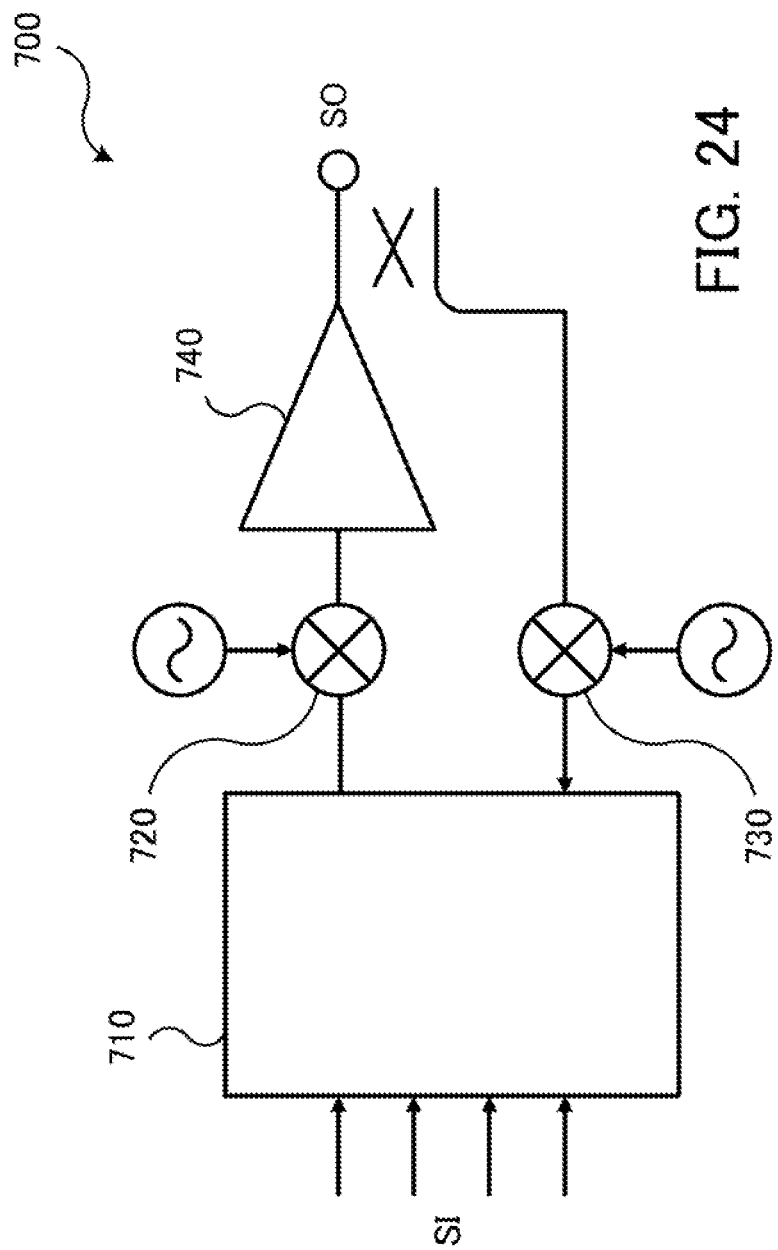
FIG. 24 illustrates an example of an amplifier according to an eighth embodiment.

FIG. 24 illustrates an example of an amplifier according to the eighth embodiment. More specifically, FIG. 24 is an equivalent circuit of an example of an amplifier according to an eighth embodiment.

This amplifier 700 illustrated in FIG. 24 includes a digital pre-distortion circuit 710, a mixer 720, a mixer 730, and a power amplifier 740.

The digital pre-distortion circuit 710 compensates non-linear distortion of input signals. The mixer 720 mixes an input signal SI, which is obtained after the non-linear distortion has been compensated, with an alternating-current (AC) signal. The power amplifier 740 amplifies a signal, which is obtained after the input signal SI and the AC signal have been mixed. For example, by changing a switch, the amplifier 700 allows the mixer 730 to mix an output signal SO with an AC signal and to send the mixed signal to the digital pre-distortion circuit 710. The amplifier 700 may be used as a high frequency amplifier or a high output amplifier.

For example, the semiconductor device 1A, 1B, 100A, 100B, 100C, 100D, 100E, or 100F may be used for the power amplifier 740 of the amplifier 700 having the above configuration.

As described above, for example, in the case of each of the semiconductor devices 1A, 1B, 100A, 100B, 100C, 100D, 100E, and 100F, an Au-containing layer is used as the first layer 10 or the seed layer 110 serving as a base layer of the second layer 20 or the mask layer 120 containing Ni serving as a mask when the semiconductor substrate 40 or 140 is etched by using Cl-based gas. In this way, since occurrence of side etching on the first layer 10 or the seed layer 110 formed on the inner surface of the via hole 50 or 150 formed by etching the semiconductor substrate 40 or 140 by using Cl-based gas is prevented, disconnection of the via wiring 60 or 160 formed on the inner surface is prevented. Thus, for example, the high performance semiconductor devices 1A, 1B, 100A, 100B, 100C, 100D, 100E, and 100F, each of which has a low source inductance or emitter inductance resulting from GND connection via the via wiring 60 or 160, are obtained. In addition, the high performance amplifier 700 using, for example, the semiconductor device 1A, 1B, 100A, 100B, 100C, 100D, 100E, or 100F having such excellent characteristics is obtained.

Various kinds of electronic devices (for example, the amplifier 700 according to the above eighth embodiment) to which, for example, the above semiconductor devices 1A, 1B, 100A, 100B, 100C, 100D, 100E, and 100F have been applied may be mounted on various kinds of electronic equipment or electronic apparatuses. For example, these electronic devices may be mounted on various kinds of electronic equipment or electronic apparatuses such as a computer (a personal computer, a supercomputer, a server, etc.), a smartphone, a mobile phone, a tablet terminal, a sensor, a camera, audio equipment, a measuring apparatus, an inspection apparatus, and a manufacturing apparatus.

In one aspect, there is obtained a high performance semiconductor device whose via wiring that passes through a semiconductor substrate is not disconnected.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
  a semiconductor substrate;
  a first layer containing gold (Au) and provided on a first surface of the semiconductor substrate;
  a second layer containing nickel (Ni) and provided on a second surface of the first layer, the second surface being opposite to the semiconductor substrate;
  a via hole passing through the second layer, the first layer, and the semiconductor substrate from the first surface to a third surface opposite to the first surface;
  a via wiring provided on an inner surface of the via hole; and
  a wiring provided on a fourth surface of the second layer, the fourth surface being opposite to the first layer, the wiring continuing from the via wiring,
  the first layer and the second layer are provided over the first surface of the semiconductor substrate, and are not provided in the via hole of the semiconductor substrate.

2. The semiconductor device according to claim 1, further comprising a third layer provided on the third surface of the semiconductor substrate, wherein the via hole passes through the second layer, the first layer, and the semiconductor substrate from the first surface to the third surface and reaches the third layer.

3. The semiconductor device according to claim 2, further comprising a transistor provided at the third surface of the semiconductor substrate and including an electrode, wherein the third layer is connected to the electrode of the transistor.

4. The semiconductor device according to claim 1, wherein
  the semiconductor substrate includes a nitride semiconductor substrate and a nitride semiconductor layer stacked on the nitride semiconductor substrate, and
  the first surface of the semiconductor substrate is a surface of the nitride semiconductor substrate, the surface being opposite to the nitride semiconductor layer.

5. The semiconductor device according to claim 4, wherein the nitride semiconductor substrate is an $In_xAl_yGa_{1-(x+y)}N$ substrate ($0 \leq x \leq 1$, $0 \leq y \leq 1$, $0 \leq x+y \leq 1$).

6. The semiconductor device according to claim 4, wherein the nitride semiconductor layer includes at least one $In_xAl_yGa_{1-(x+y)}N$ layer ($0 \leq x \leq 1$, $0 \leq y \leq 1$, $0 \leq x+y \leq 1$).

7. The semiconductor device according to claim 4, wherein the third surface of the semiconductor substrate is a surface of the nitride semiconductor layer, the surface being opposite to the nitride semiconductor substrate.

8. The semiconductor device according to claim 4, wherein the third surface of the semiconductor substrate is a surface of the nitride semiconductor substrate, the surface being opposite to the first surface.

9. A semiconductor device manufacturing method, comprising:
forming a first layer containing gold (Au) on a first surface of a semiconductor substrate;
forming a second layer containing nickel (Ni) on a second surface of the first layer, the second surface being opposite to the semiconductor substrate;
forming a via hole passing through the second layer, the first layer, and the semiconductor substrate from the first surface to a third surface opposite to the first surface; and
forming a via wiring on an inner surface of the via hole, the forming of the via hole includes forming the second layer and the first layer, each of which has an opening portion in a region where the via hole is to be formed, and etching the semiconductor substrate in the opening portions by using the second layer having the opening portion as a mask and by using Cl-containing gas.

10. The semiconductor device manufacturing method according to claim 9, further comprising forming a third layer on the third surface of the semiconductor substrate, wherein the forming of the via hole includes forming such that the via hole passes through the second layer, the first layer, and the semiconductor substrate from the first surface to the third surface and reaches the third layer.

11. The semiconductor device manufacturing method according to claim 10, further comprising forming a transistor having an electrode connected to the third layer at the third surface of the semiconductor substrate.

12. The semiconductor device manufacturing method according to claim 9, wherein
the semiconductor substrate includes a nitride semiconductor substrate and a nitride semiconductor layer stacked on the nitride semiconductor substrate, and
the first surface of the semiconductor substrate is a surface of the nitride semiconductor substrate, the surface being opposite to the nitride semiconductor layer.

13. The semiconductor device manufacturing method according to claim 12, wherein the third surface of the semiconductor substrate is a surface of the nitride semiconductor layer, the surface being opposite to the nitride semiconductor substrate.

14. The semiconductor device manufacturing method according to claim 12, wherein the third surface of the semiconductor substrate is a surface of the nitride semiconductor substrate, the surface being opposite to the first surface.

15. An electronic apparatus, comprising:
a semiconductor device including
a semiconductor substrate,
a first layer containing gold (Au) and provided on a first surface of the semiconductor substrate;
a second layer containing nickel (Ni) and provided on a second surface of the first layer, the second surface being opposite to the semiconductor substrate;
a via hole passing through the second layer, the first layer, and the semiconductor substrate from the first surface to a third surface opposite to the first surface;
a via wiring provided on an inner surface of the via hole; and
a wiring provided on a fourth surface of the second layer, the fourth surface being opposite to the first layer, the wiring continuing from the via wiring,
the first layer and the second layer are provided over the first surface of the semiconductor substrate, and are not provided in the via hole of the semiconductor substrate.

* * * * *